United States Patent
Kusano et al.

(10) Patent No.: US 11,335,633 B2
(45) Date of Patent: May 17, 2022

(54) CIRCUIT MODULE AND POWER SUPPLY CHIP MODULE

(71) Applicant: AISIN CORPORATION, Kariya (JP)

(72) Inventors: Takashi Kusano, Toyota (JP); Takanobu Naruse, Nishio (JP)

(73) Assignee: AISIN CORPORATION, Kariya (JP)

( * ) Notice: Subject to any disclaimer, the term of this patent is extended or adjusted under 35 U.S.C. 154(b) by 0 days.

(21) Appl. No.: 16/972,793

(22) PCT Filed: May 27, 2019

(86) PCT No.: PCT/JP2019/020914
§ 371 (c)(1),
(2) Date: Dec. 7, 2020

(87) PCT Pub. No.: WO2020/012796
PCT Pub. Date: Jan. 16, 2020

(65) Prior Publication Data
US 2021/0249344 A1  Aug. 12, 2021

(30) Foreign Application Priority Data
Jul. 10, 2018 (JP) .............................. JP2018-130940

(51) Int. Cl.
*H01R 9/00* (2006.01)
*H01L 23/498* (2006.01)
(Continued)

(52) U.S. Cl.
CPC .. *H01L 23/49838* (2013.01); *H01L 23/49816* (2013.01); *H01L 25/18* (2013.01);
(Continued)

(58) Field of Classification Search
CPC ............... H01L 23/49838; H01L 25/18; H01L 23/49816; H01L 25/105; H01L 23/49833;
(Continued)

(56) References Cited

U.S. PATENT DOCUMENTS

| | | | | |
|---|---|---|---|---|
| 2002/0021560 A1* | 2/2002 | Jauregui | ............... | H02M 7/003 361/760 |
| 2012/0187564 A1* | 7/2012 | Tsuge | ................ | H01L 23/49827 257/773 |
| 2012/0211897 A1* | 8/2012 | Hoshi | ................. | H01L 23/5226 257/774 |
| 2013/0063902 A1* | 3/2013 | Yoshida | ............... | H05K 1/0209 361/728 |

(Continued)

FOREIGN PATENT DOCUMENTS

| EP | 3312878 A1 | 4/2018 |
|---|---|---|
| JP | 2003-528449 A | 9/2003 |

(Continued)

OTHER PUBLICATIONS

International Search Report for PCT/JP2019/020914, dated Aug. 6, 2019.

(Continued)

*Primary Examiner* — Andargie M Aychillhum
(74) *Attorney, Agent, or Firm* — Sughrue Mion, PLLC

(57) ABSTRACT

Provided is a circuit module including a power supply chip module, a load chip module, and a system board. A power supply output terminal group of the power supply chip module is arranged side by side in a row along a side of the power supply chip module board, the power supply input terminal group of a load chip module includes a specific terminal group arranged in a specific row that is a row along a side of the load chip module board, and a wiring width along an arrangement direction of the power supply output terminal group of a wiring pattern in which the power supply output terminal group is connected to the system board is equal to or more than a wiring width W31 along an arrangement direction of the specific terminal group of the wiring pattern in which the specific terminal group is connected to the system board.

13 Claims, 9 Drawing Sheets

(51) Int. Cl.
  *H01L 25/18* (2006.01)
  *H05K 1/02* (2006.01)
  *H05K 1/11* (2006.01)
  *H05K 1/18* (2006.01)
  *H01L 25/10* (2006.01)

(52) U.S. Cl.
  CPC ........... *H05K 1/0298* (2013.01); *H05K 1/112* (2013.01); *H05K 1/181* (2013.01); *H01L 23/49833* (2013.01); *H01L 25/105* (2013.01); *H05K 2201/09227* (2013.01); *H05K 2201/09409* (2013.01); *H05K 2201/09609* (2013.01); *H05K 2201/09672* (2013.01); *H05K 2201/09727* (2013.01); *H05K 2201/10522* (2013.01); *H05K 2201/10545* (2013.01)

(58) Field of Classification Search
  CPC ...... H05K 1/112; H05K 1/181; H05K 1/0298; H05K 2201/09409; H05K 2201/09609; H05K 2201/09227; H05K 2201/09672; H05K 2201/09727; H05K 2201/10545; H05K 2201/10522
  USPC .......................................................... 361/772
  See application file for complete search history.

(56) References Cited

U.S. PATENT DOCUMENTS

| | | | |
|---|---|---|---|
| 2014/0104953 A1 | 4/2014 | Itakura et al. | |
| 2015/0137363 A1* | 5/2015 | Ozawa | H01L 23/49838 257/738 |
| 2015/0162070 A1* | 6/2015 | Sato | G11C 5/04 365/193 |
| 2016/0372606 A1* | 12/2016 | Ito | H01L 27/1225 |
| 2017/0350933 A1* | 12/2017 | Uematsu | H01L 23/49838 |
| 2018/0197801 A1* | 7/2018 | Naruse | H05K 1/0262 |
| 2018/0204827 A1 | 7/2018 | Betsui et al. | |

FOREIGN PATENT DOCUMENTS

| | | | |
|---|---|---|---|
| JP | 2014-82245 A | | 5/2014 |
| JP | WO2017038905 | * | 3/2017 |
| JP | WO20200157877 | * | 8/2020 |
| WO | 2016/046987 A1 | | 3/2016 |
| WO | 2017/038905 A1 | | 3/2017 |

OTHER PUBLICATIONS

Supplementary European Search Report dated Jun. 10, 2021 from the European Patent Office in EP Appiication No. 19833691.9.

* cited by examiner

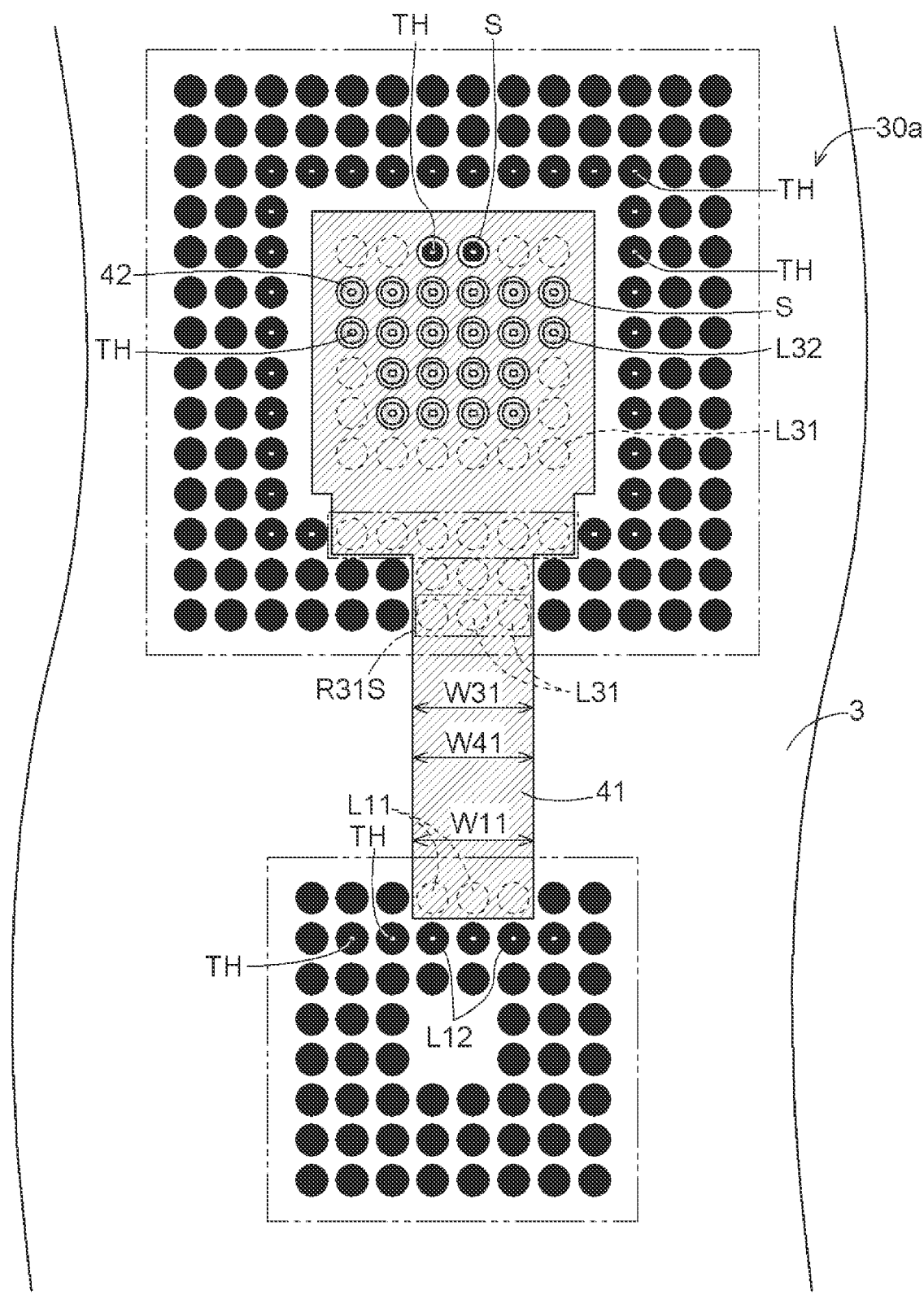

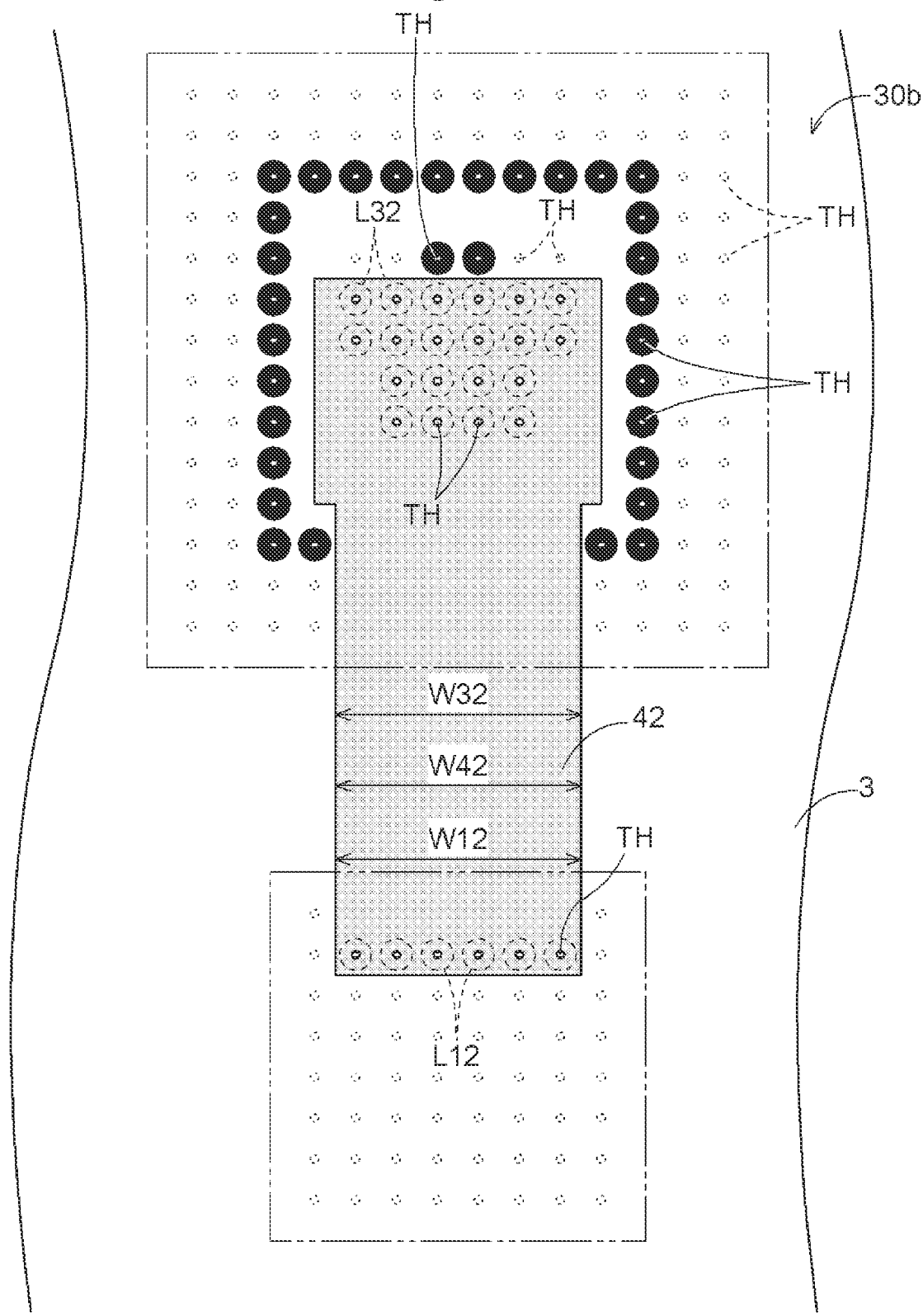

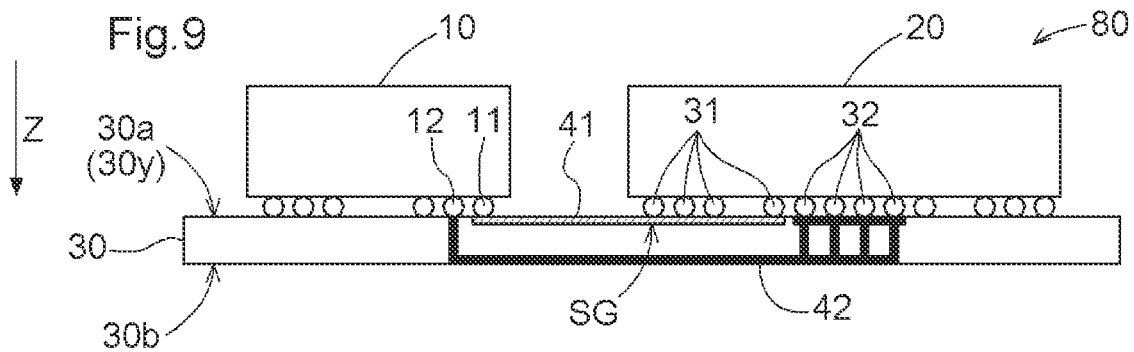
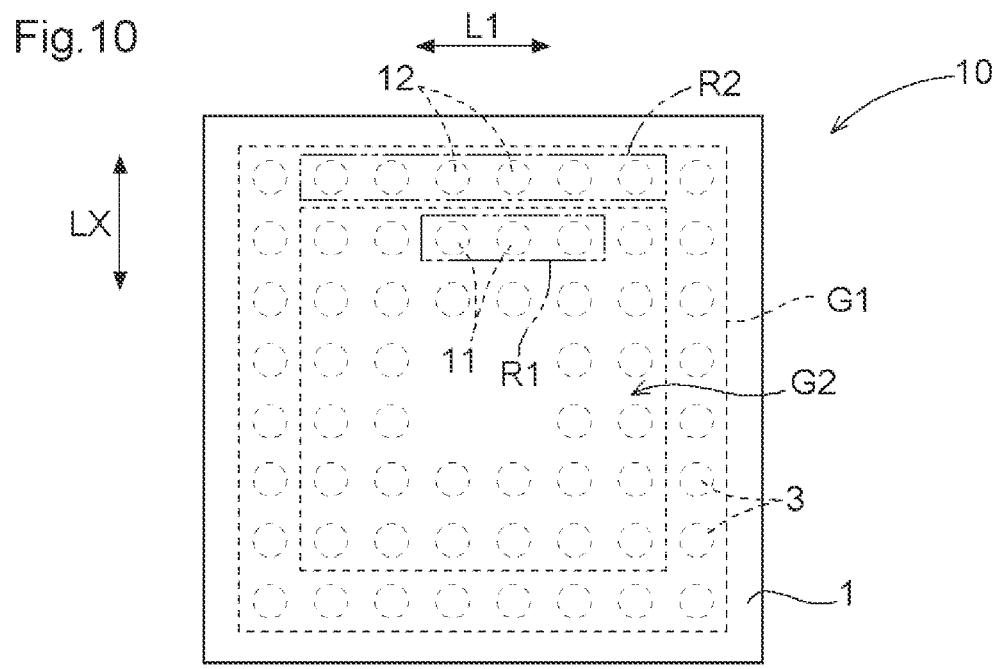
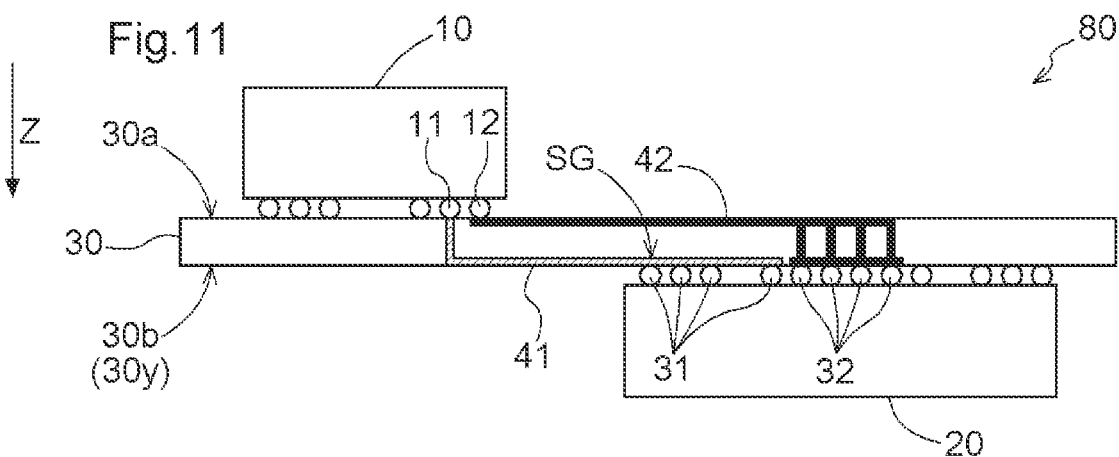

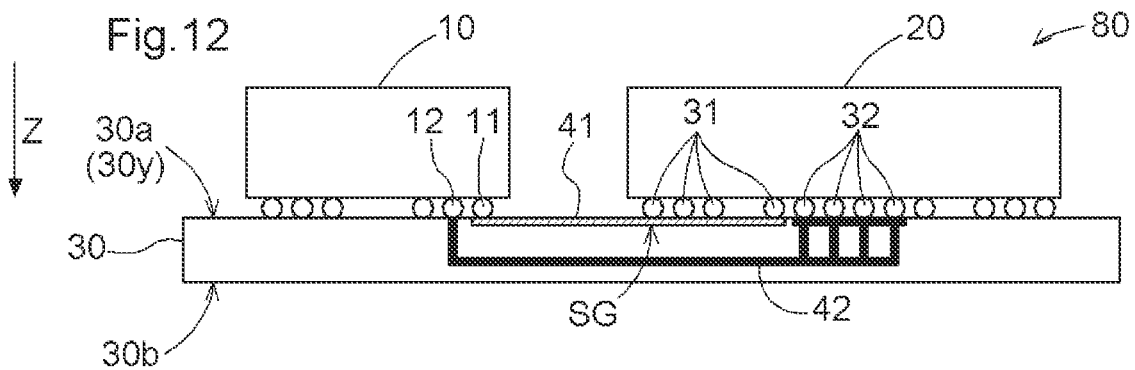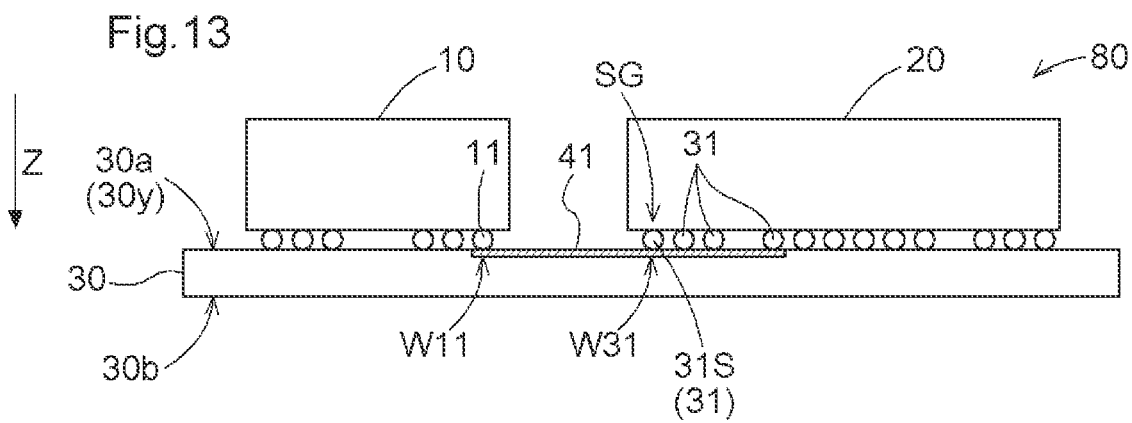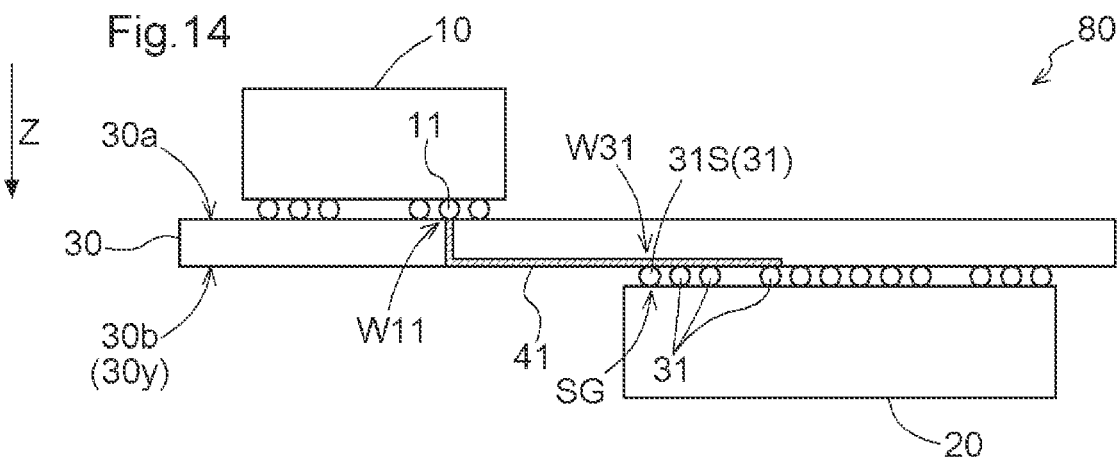

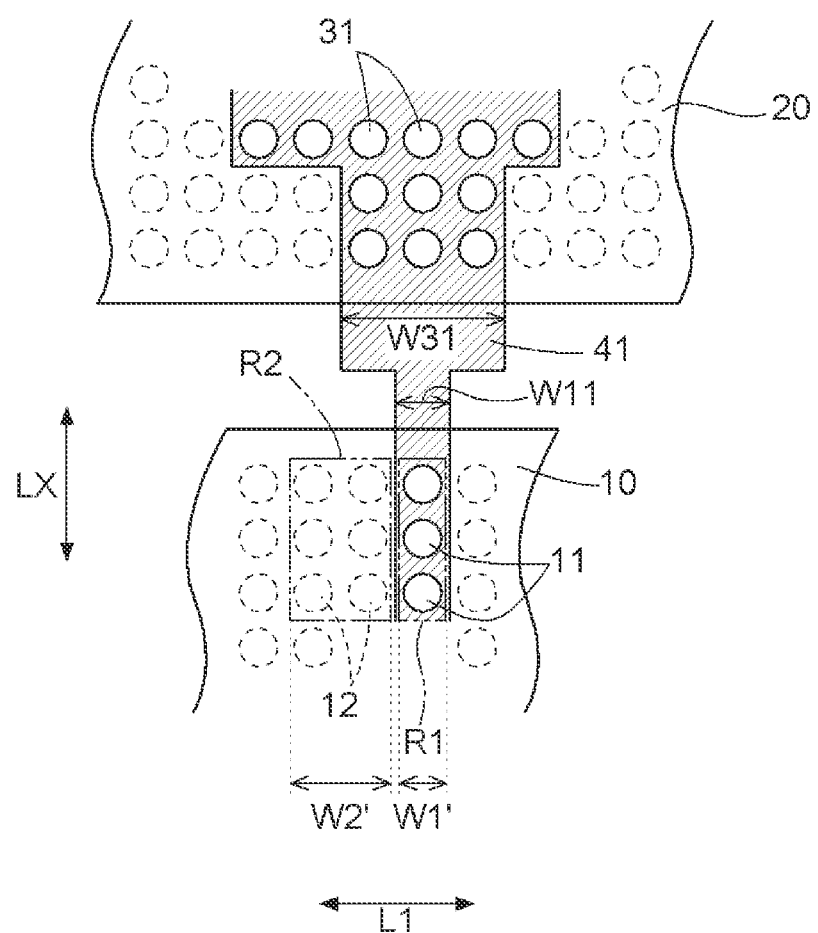

US 11,335,633 B2

CIRCUIT MODULE AND POWER SUPPLY CHIP MODULE

CROSS REFERENCE TO RELATED APPLICATIONS

This Application is a National Stage of International Application No. PCT/JP2019/020914 filed May 27, 2019, which designates the United States, and which claims the benefit of priority from Japanese Patent Application No. 2018-130940 Filed Jul. 10, 2018, the entire contents of which are incorporated herein by reference.

TECHNICAL FIELD

The present disclosure relates to a circuit module including a power supply chip module, a load chip module, and a system board that supports the power supply chip module and the load chip module, and the power supply chip module.

BACKGROUND ART

Japanese Unexamined Patent Application Publication No. 2014-82245 (JP 2014-82245 A) discloses a semiconductor memory device having a controller (201) and a power supply IC (202) (numerals in parentheses in the BACKGROUND ART refer to those of the referenced document). The power supply IC (202) generates a plurality of different power supply voltages and supplies them to the controller (201). Among terminals of the controller (201), a larger amount of current flows in a power supply terminal used for inputting/outputting the power supply than a signal terminal used for inputting/outputting the signal. Thus, in many cases, a plurality of terminals are allocated to the power supply terminals corresponding to one power supply. When the terminals are in a ball grid array (BGA) or the like and are planarly arranged in a rectangular annular shape, a plurality of power supply terminals corresponding to one power supply are arranged side by side from the center toward an outer peripheral side.

In addition, a larger amount of current flows through a wiring pattern of transmitting power on the mounting board as compared with the wiring pattern of transmitting signals. Thus, the power supply wiring pattern is generally formed broader than the signal wiring pattern (so that the effective cross-sectional area is larger). However, when the power supply terminals corresponding to one power supply are arranged side by side from the center of the power supply IC (202) toward the outer peripheral side, it is difficult to widen the wiring pattern in the direction along the mounting board surface in order to maintain insulation from the terminals adjacent in the circumferential direction. Thus, in many cases, the effective cross-sectional area of the wiring pattern of the power supply is ensured using the inner layer, with the mounting board constructed as a multilayer board. For the multilayer board, there is a possibility that the production cost increases as the number of layers increases. Thus, it is desirable that an increase in the power wiring layer of the mounting board is suppressed and load electronic components such as the controller (201) and power electronic components such as the power IC (202) can be connected.

RELATED ART DOCUMENTS

Patent Documents

Patent Document 1: Japanese Unexamined Patent Application Publication No. 2014-82245 (JP 2014-82245 A)

SUMMARY OF THE DISCLOSURE

Problem to be Solved by Various Aspects of the Disclosure

In view of the above background, it is desired that a technique capable of appropriately connecting a power supply source and a power supply destination while suppressing an increase in a wiring layer of a mounting board is provided.

Means for Solving the Problem

As one aspect, a circuit module in view of the above includes: a power supply chip module including a power supply chip module board that has a rectangular plate shape, at least one power supply semiconductor chip that is supported on an upper surface of the power supply chip module board, and a plurality of connection terminals that is arranged in a plurality of rows in a rectangular annular shape along each side of the power supply chip module board on a lower surface of the power supply chip module board and that is electrically connected to the power supply semiconductor chip; a load chip module including a load chip module board that has a rectangular plate shape, at least one load semiconductor chip that is supported on an upper surface of the load chip module board, and a plurality of load side connection terminals that is arranged in a plurality of rows in a rectangular annular shape along each side of the load chip module board on a lower surface of the load chip module board and that is electrically connected to the load semiconductor chip; and a system board that supports the power supply chip module and the load chip module, in which a power supply output terminal group having a plurality of terminals is included in the connection terminals, a power supply input terminal group having a plurality of terminals connected to the power supply output terminal group is included in the load side connection terminals, the power supply output terminal group is arranged side by side in a row along at least one side of the power supply chip module board, the power supply input terminal group includes a specific terminal group arranged in a specific row that is a row along at least one side of the load chip module board, and a wiring width along an arrangement direction of the power supply output terminal group of a wiring pattern in which the power supply output terminal group is connected to the system board is equal to or more than a wiring width along an arrangement direction of the specific terminal group of the wiring pattern in which the specific terminal group is connected to the system board.

The load chip module is provided with a power supply input terminal group having an appropriate number of terminals in accordance with the current consumption of the load chip module. In contrast, the power supply chip module is provided with a power supply output terminal group having an appropriate number of terminals so that the maximum current can be output within the output range of the power supply chip module. As a matter of course, the power supply chip module used has a specification in which current can be sufficiently supplied even when the load chip module consumes the maximum current. In other words, the maximum current consumption of the load chip module is smaller than the maximum output current of the power supply chip module. Thus, the effective sectional area of the wiring connected to the power supply input terminal group may be smaller than the effective sectional area of the wiring connected to the power supply output terminal group. According to the present configuration, the wiring width of the wiring pattern to which the power supply output terminal group is connected is equal to more than the wiring width of the wiring pattern in which the power supply input terminal group is connected. Thus, the power supply chip module and the load chip module can be appropriately connected.

As one aspect, a power supply chip module in view of the above is a power supply chip module board including: a power supply chip module that has a rectangular plate shape; at least one a power supply semiconductor chip that is supported on an upper surface of the power supply chip module board; and a plurality of connection terminals that is arranged in a plurality of rows in a rectangular annular shape along each side of the power supply chip module board on a lower surface of the power supply chip module board and that is electrically connected to the power supply semiconductor chip, in which the connection terminals include a first power supply output terminal group having a plurality of terminals that outputs a first voltage and a second power supply output terminal group having a plurality of terminals that outputs a second voltage, one power supply output terminal group of the first power supply output terminal group and the second power supply output terminal group is arranged in an outermost peripheral row that is an outermost peripheral row along at least one side of the power supply chip module board, the other power supply output terminal group of the first power supply output terminal group and the second power supply output terminal group is arranged along an arrangement direction of the power supply output terminal group in the outermost peripheral row, in one inner peripheral row that is an inner peripheral row of the outermost peripheral row, and a first region in which the first power supply output terminal group is arranged and a second region in which the second power supply output terminal group is arranged are at least partially overlapped, when viewed in a direction that is along the power supply chip module board and that is orthogonal to the arrangement direction.

According to this configuration, the power supply output terminal group arranged side by side in the outermost peripheral row and the power supply destination can be connected by the surface wiring formed on the mounting surface of the board on which the power supply chip module is mounted. In addition, since the power supply output terminal groups arranged side by side in the outermost peripheral row are adjacent to each other in the circumferential direction of the connection terminals arranged in a rectangular annular shape, it is possible to provide the surface layer wiring having a sufficient wiring width in the direction along the arrangement direction and in which a wiring impedance is suppressed. Since the power supply output terminal group arranged in the inner peripheral row is at least partially overlapped with the power output terminal group arranged in the outermost peripheral row when viewed in the direction orthogonal to the arrangement direction, it is difficult for the power supply output terminal group arranged in the inner peripheral row to connect to the power supply destination by the surface wiring on the mounting surface. However, with the wiring provided on another wiring layer other than the surface wiring on the mounting surface of the board, the power supply output terminal group arranged in the inner peripheral row can be appropriately connected to the power supply destination. That is, since a sufficient wiring width can be secured in the surface direction of the board on which the power supply chip module is mounted, and a sufficient effective sectional area of the wiring can be ensured, there is no need to expand the effective sectional area of the wiring in the thickness direction of the board. Thus, it is possible to suppress an increase in the wiring layer (inner wiring layer) of the board. As described above, according to the present configuration, it is possible to appropriately connect the power supply source and the power supply destination while suppressing an increase in the wiring layer of the mounting board.

Further features and advantages of the power supply chip module and the circuit module will become clear from the following description of an embodiment described with reference to the drawings.

BRIEF DESCRIPTION OF THE DRAWINGS

FIG. 7 is a schematic view showing an example of a wiring pattern of a power supply wiring on a first surface of a system board.

FIG. 8 is a schematic view showing an example of a wiring pattern of a power supply wiring on a second surface of the system board.

FIG. 9 is a cross-sectional view schematically showing an example of a wiring pattern of a power supply wiring of the system board.

FIG. 10 is a schematic perspective view showing another example of the terminal arrangement of the power supply chip module.

FIG. 11 is a cross-sectional view schematically showing another example of the wiring pattern of the power supply wiring of the system board.

FIG. 12 is a cross-sectional view schematically showing an example of a wiring pattern of a power supply wiring using an inner wiring layer.

FIG. 13 is a cross-sectional view schematically showing an example of a wiring pattern of the power supply wiring of one system.

FIG. 14 is a cross-sectional view schematically showing another example of the wiring pattern of the power supply wiring of one system.

FIG. 16 is a diagram schematically showing a comparative example of the wiring pattern of the power supply wiring on the first surface of the system board.

DETAILED DESCRIPTION

Figure 1:
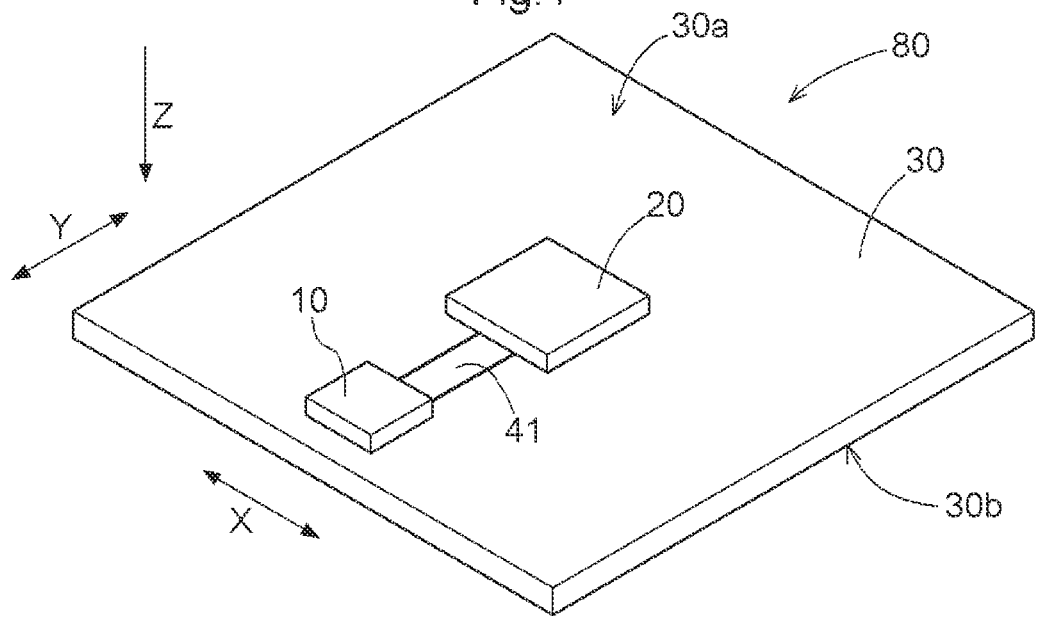
FIG. 1 is a schematic external view of a circuit module.

Hereinafter, an embodiment of a power supply chip module that is a power supply source, and a circuit module configured by including the power supply chip module and a load chip module that is a power supply destination of the power supply chip module will be described with reference to the drawings. As shown in FIG. 1, a circuit module 80 includes a power supply chip module 10, a load chip module 20, and a system board 30 serving as a mounting board that supports the power supply chip module 10 and the load chip module 20. The load chip module 20 is connected to the power supply chip module 10 and is supplied with power from the power supply chip module 10. FIG. 1 shows as an example, a form in which the power supply chip module 10 and the load chip module 20 are supported on a system board first surface 30a, and a first power supply wiring pattern 41 (first wiring pattern) is formed on the system board first surface 30a. As shown in FIG. 9, which is a cross-sectional view of the circuit module 80, a second power supply wiring pattern 42 (second wiring pattern) is formed on a system board second surface 30b.

Hereinafter, a direction orthogonal to the system board 30 from a side of the system board first surface 30a is referred to as a "Z direction", and an arrangement direction in which the power supply chip module 10 and the load chip module 20 are arranged side by side along the board surface of the system board 30 is referred to as a "Y direction", and a direction orthogonal to the "Z direction" and the "Y direction" is referred to as an "X direction". Further, when indicating the arrangement of connection terminals 3 of the power supply chip module 10 and load side connection terminals 23 of the load chip module 20 shown in FIGS. 2 and 3, the arrangement is shown as a perspective view in FIG. 1 as viewed in the Z direction.

Figure 2:
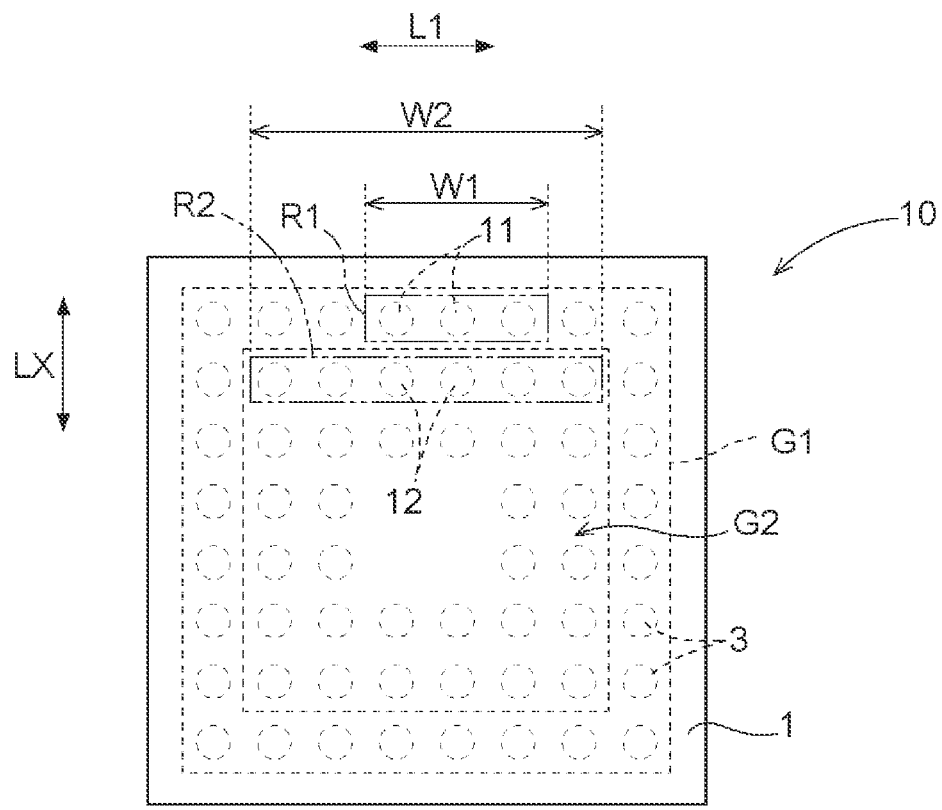
FIG. 2 is a schematic perspective view showing an example of a terminal arrangement of a power supply chip module.
Figure 4:
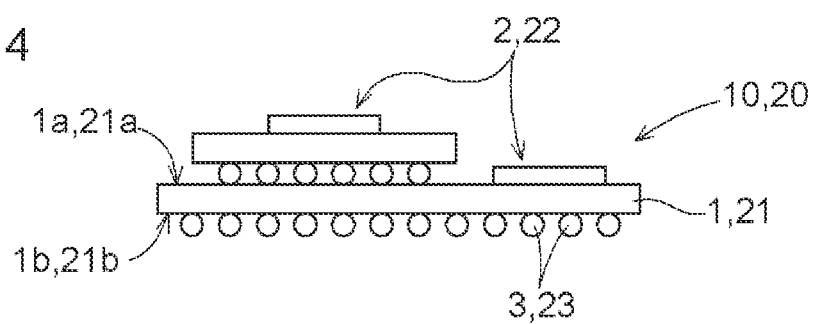
FIG. 4 is a schematic cross-sectional view showing a structure of the power supply chip module and the load chip module.

As shown in FIG. 4, the power supply chip module 10 includes a rectangular plate-shaped power supply chip module board 1, at least one power supply semiconductor chip 2 supported on an upper surface 1a of the power supply chip module board 1, and a plurality of connection terminals 3 that are arranged on a lower surface 1b of the power supply chip module board 1 and that are electrically connected to the power supply semiconductor chip 2. As shown in FIG. 2, the connection terminals 3 are arranged in a plurality of rows of rectangular rings along each side of the power supply chip module board 1.

Figure 3:
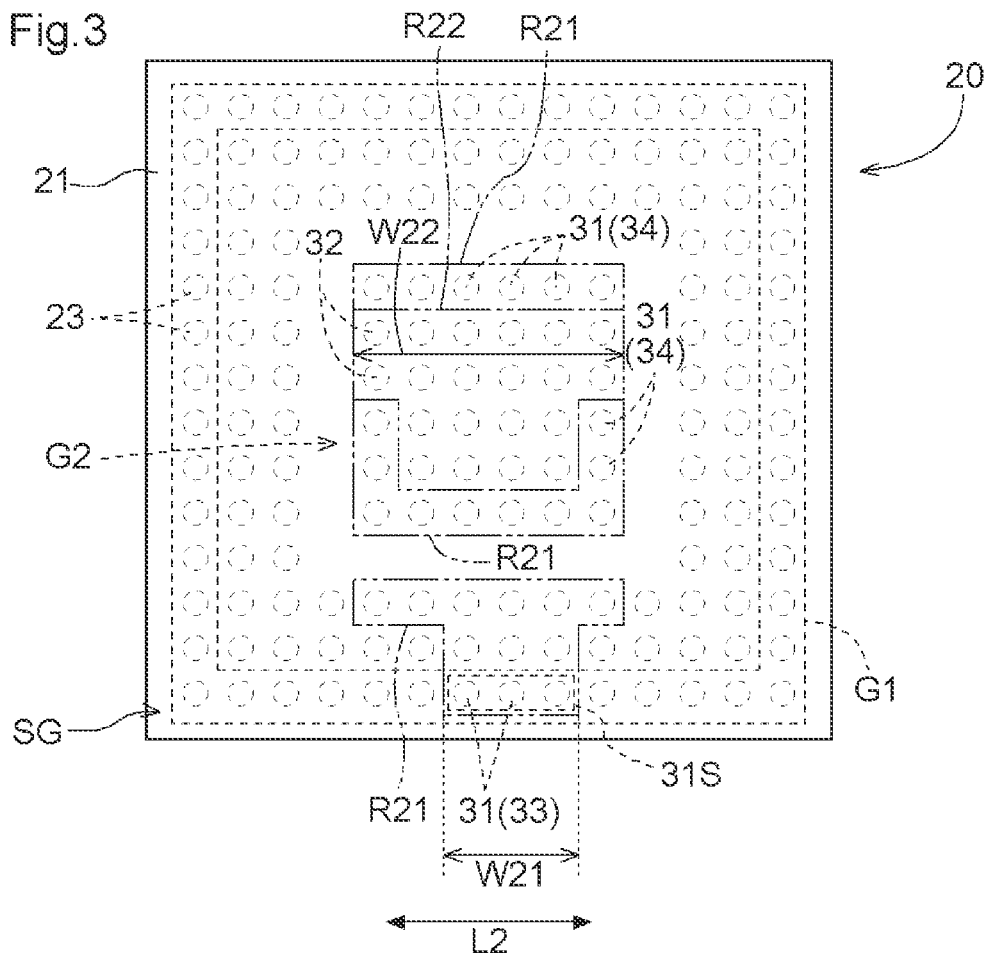
FIG. 3 is a schematic perspective view showing an example of a terminal arrangement of a load chip module.

Similarly, the load chip module 20 includes a rectangular plate-shaped load chip module board 21, at least one load semiconductor chip 22 supported on an upper surface 21a of the load chip module board 21, and the load side connection terminals 23 that are arranged on a lower surface 21b of the load chip module board 21 and that are electrically connected to the load semiconductor chip 22. The load side connection terminals 23 are also arranged in a plurality of rows of rectangular annular shape along each side of the load chip module board 21, as shown in FIG. 3.

As shown in FIG. 2, the connection terminals 3 of the power supply chip module 10 include a first power supply output terminal group 11 having a plurality of terminals that output a first voltage, and a second power supply output terminal group 12 having a plurality of terminals that output a second voltage. The first voltage and the second voltage may be different voltages or the same voltage. The current that can be output from the power supply chip module 10 is larger in the second power supply output terminal group 12 than in the first power supply output terminal group 11, so that more connection terminals 3 are allocated to the second power supply output terminal group 12. Here, an example is shown in which the first power supply output terminal group 11 is allocated with three connection terminals 3 and the second power supply output terminal group 12 is allocated with six connection terminals 3.

In this example, the first power supply output terminal group 11 is arranged side by side in an outermost peripheral row G1, which is the outermost peripheral row along at least one side of the power supply chip module board 1. Hereinafter, a direction in which the first power supply output terminal group 11 is arranged is referred to as an arrangement direction L1. Here, a region where the first power supply output terminal group 11 is arranged is referred to as a first region R1. In contrast, the second power supply output terminal group 12 is arranged side by side along the arrangement direction L1 of the first power supply output terminal group 11 in one of inner peripheral rows G2 which is the inner row of outermost peripheral row G1. Here, the region in which the second power supply output terminal group 12 is arranged is referred to as a second region R2.

In FIG. 2 and the like, an example is shown in which the first power supply output terminal group 11 is arranged in one row along one side of the power supply chip module board 1. However, the first power supply output terminal group 11 may be arranged side by side across two adjacent sides with a corner interposed therebetween. When the first power supply output terminal group 11 is arranged side by side along one side of the power supply chip module board 1, the arrangement direction L1 is straight. When the first power supply output terminal group 11 is arranged side by side across two sides, it is preferable that the direction along one side on the side on which more terminals are arranged or the direction along one side on a side parallel to the arrangement direction along the side of the second power supply output terminal group 12 (the arrangement direction along the side on the side on which more terminals are arranged when the second power supply output terminal group 12 is also arranged across two sides similar to the first power supply output terminal group 11) be set as the arrangement direction L1.

FIG. 2 shows an example of a form in which the entire first region R1 in which the first power supply output terminal group 11 is arranged along the arrangement direction L1 is overlapped with the second region R2 in which the second power supply output terminal group 12 is arranged along the arrangement direction L1, when viewed in a direction (when viewed in an LX direction) that is along the power supply chip module board 1 and that is orthogonal to the arrangement direction L1. Here, an example is shown in which the number of terminals of the second power supply output terminal group 12 is larger than that of the first power supply output terminal group 11, and the entire first region R1 overlaps with the second region R2 when viewed in the LX direction. However, the form may be such that the number of terminals of the first power supply output terminal group 11 is larger than that of the second power supply output terminal group 12, and the entire second region R2 is overlapped with the first region R1 when viewed from the LX direction. That is, among the first power supply output terminal group 11 and the second power supply output terminal group 12, the one with the larger number of terminals is a many-terminal group and the one with the smaller number of terminals is a few-terminal group, and the entire region in which the few-terminal group is arranged along the arrangement direction L1 may overlap with the region in which the many-terminal group is arranged along the arrangement direction L1, when viewed in the LX direction. Here, an example is shown in which the entire region in which the few-terminal group is arranged along the arrangement direction L1 overlaps with the region in which the many-terminal group is arranged along the arrangement direction L1 when viewed in the LX direction. However, the form may be such that the first region R1 and the second region R2 are at least partially overlapped with each other when viewed in the LX direction.

There may be a case in which, on the mounting surface (here, the system board first surface 30a) of the system board 30 on which the power supply chip module 10 is mounted, the power supply output terminal group (11, 12) and the power supply wiring pattern (41, 42) connected to the power supply output terminal group (11, 12) prevent the wiring path of a signal input terminal from the central portion of the power supply chip module 10 to the outer peripheral side from being laid. Since the entire region in which the few-terminal group is arranged overlaps with the region in which the many-terminal group is arranged, it is possible to reduce the possibility that the wiring path from the signal input terminal is prevented from being laid and make it easy to secure the wiring path. It is possible to reduce the possibility that the wiring path from the signal input terminal is prevented from being laid to a certain extend by overlapping a part of the region in which the few-terminal group is arranged with the region in which the many-terminal group is arranged. Thus, the wiring path is easily ensured, compared to when there is no overlapping at all.

As shown in FIG. 3, the load side connection terminal 23 of the load chip module 20 includes a first power supply input terminal group 31 having a plurality of terminals connected to the first power supply output terminal group 11, and a second power supply input terminal group 32 having a plurality of terminals connected to the second power supply output terminal group 12. Here, the region in which the first power supply input terminal group 31 is arranged is referred to as a load side first region R21, and the region in which the second power supply input terminal group 32 is arranged is referred to as a load side second region R22. Here, in the row closest to the outermost peripheral row G1 (a specific row SG shown in FIG. 3), an arrangement direction of the power supply input terminal group (the first power supply input terminal group 31 or the second power supply input terminal group 32) that is arranged along at least one side of the load chip module board 21 is defined as a load side arrangement direction L2. In the form shown in FIG. 3, a specific terminal group 31S is configured by the three load side connection terminals 23 arranged in the specific row SG, and the arrangement direction of the three load side connection terminals 23 of the specific terminal group 31S is the load side arrangement direction is L2.

Here, as a particularly preferable form, a form is shown as an example in which the specific row SG is set in the outermost peripheral row G1 of the load side connection terminals 23 arranged in a rectangular ring. However, the specific row SG may be set as a row on an inner side of the outermost peripheral row G1. In addition, here, shown as a particularly preferable form is a form in which the entire specific terminal group 31S arranged in the specific row SG is included in the first power supply input terminal group 31. However, the specific terminal group 31S may include both the load side connection terminal 23 included in the first power supply input terminal group 31 and the load side connection terminal 23 included in the second power supply input terminal group 32. In the present embodiment, the specific row SG is set in the outermost peripheral row G1, and the entire specific terminal group 31S arranged in the specific row SG is included in the first power supply input terminal group 31 and the second power supply input terminal group 32 is arranged on the inner side of the specific row SG (on the side toward the inner side of the specific row SG).

FIG. 3 shows as an example, a form in which the first power supply input terminal group 31 includes terminals arranged in the specific row SG and the second power supply input terminal group 32 is arranged on the inner side of the specific row SG. However, the second power supply input terminal group 32 may include terminals arranged in the specific row SG, and the first power supply input terminal group 31 may be arranged on the inner side of the specific row SG. That is, one of the first power supply input terminal group 31 and the second power supply input terminal group 32 may be arranged in the specific row SG that is one of the plurality of rows along the load side arrangement direction L2, and the other one of the first power supply input terminal group 31 and the second power supply input terminal group 32 may be arranged on the inner side of the specific row SG.

Similar to the connection terminals 3 of the power supply chip module 10, the load side connection terminal 23 also includes a signal input/output terminal. On the mounting surface of the system board 30 (here, the system board first surface 30a) on which the load chip module 20 is mounted, the power supply input terminal groups (31, 32) and the power supply wiring patterns (41, 42) connected to the power supply input terminal groups (31, 32) may prevent the wiring path from the central portion of the load chip module 20 to the outer peripheral side from being laid. However, if one of the power supply input terminal groups (31, 32) is arranged in the specific row SG and the other one of the power supply input terminal groups (31, 32) is arranged on the inner side of the specific row SG, there is an increased possibility that the first power supply input terminal group 31 and the second power supply input terminal group 32 overlap at least partially in the direction orthogonal to the load side arrangement direction L2. Thus, it is possible to reduce the possibility that the wiring path of the signal input/output terminal is prevented from being laid.

As described above with reference to FIG. 4, the power supply chip module 10 includes the power supply chip module board 1, at least one power supply semiconductor chip 2, and the connection terminals 3. Further, the load chip module 20 includes the load chip module board 21, at least one load semiconductor chip 22, and the load side connection terminals 23. The form illustrated in FIG. 4 shows as an example, the form in which the power supply chip module 10 and the load chip module 20 have the plurality of semiconductor chips (2 or 22), and are configured as a hybrid IC so-called a multi-chip module (MCM). The multi-chip module is configured as a module in which at least one of the semiconductor elements (semiconductor chips) each having a specific function is mounted on one support board (1 or 21). The multi-chip module may be configured by having one semiconductor element (semiconductor chip).

Figure 5:
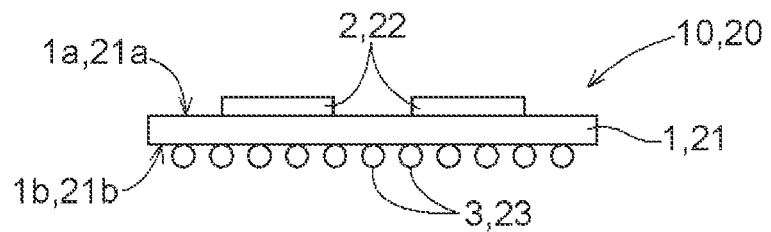
FIG. 5 is a schematic cross-sectional view showing the structure of the power supply chip module and the load chip module.

Further, in FIG. 4, shown as an example is the form in which one of the semiconductor elements is a ball grid array (BGA) type. However, as shown as an example in FIG. 5, the semiconductor element may be a small outline package (SOP) or a quad flat package (QFP). Also, a multi-chip module may be formed by having a plurality of BGA type semiconductor elements.

Figure 6:
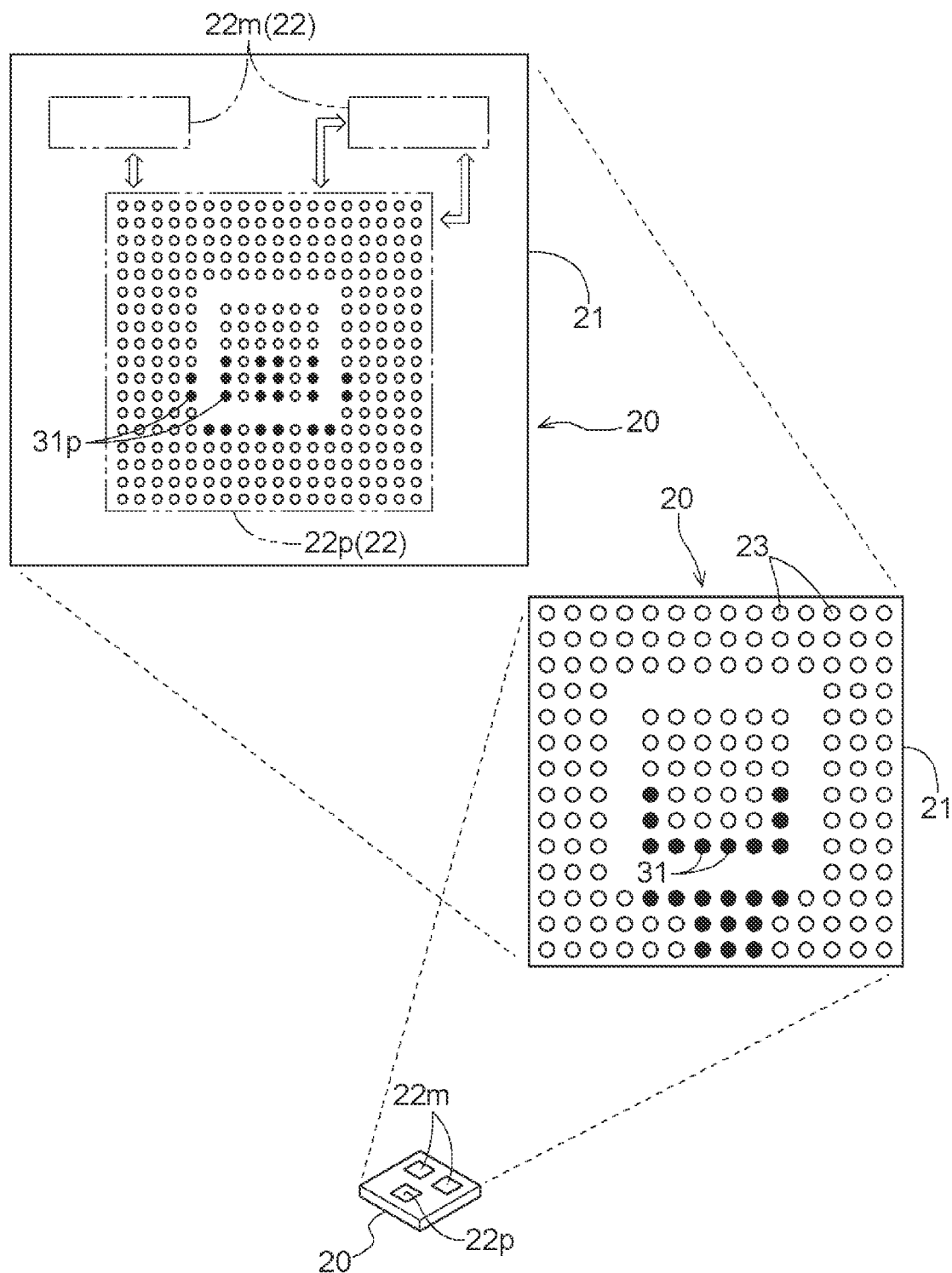
FIG. 6 is an explanatory view showing a terminal structure of the power supply chip module and the load chip module.

As shown in FIG. 6, the load chip module 20 configured as a multi-chip module is configured to include, as the load semiconductor chips 22, a processor 22p such as a microcomputer or a digital signal processor (DSP) and peripheral chips such as a memory 22m. Although not shown, the power supply chip module 10 may be configured by including a plurality of the power supply semiconductor chips 2 or may be configured by including the power supply semiconductor chip 2 and a control chip such as a controller.

In the multi-chip module, the terminal arrangement of the processor 22p can be changed on the supporting board such as the load chip module board 21. That is, the terminal arrangement of the processor 22p may be rearranged in the load chip module board 21 to arrange the load side connection terminals 23 so that the terminal arrangement is suitable for the case in which the load chip module 20 is mounted on the system board 30. When the processor 22p is a general-purpose microcomputer or a DSP, the terminal arrangement is determined by a semiconductor vendor. In the load chip module 20 serving as the multi-chip module, the terminal arrangement of the processors 22p can be rearranged on the load chip module board 21 so that the terminal arrangement is suitable for the load side connection terminal 23 of the load chip module 20. In FIG. 6, the terminal arrangement of the processor 22p and the load chip module 20 is shown in a perspective view of the lower surface (the side with the terminals) viewed from the upper surface (the side with no terminals) of the processor 22p and the load chip module 20.

As shown in FIG. 6, the processor 22p has a plurality of chip power supply terminals 31p for supplying power to the processor 22p (terminals shown in black in FIG. 6). The load chip module 20 has a load chip side power supply terminal (first power supply input terminal group 31) electrically connected to the chip power supply terminal 31p on the load chip module board 21 (similarly, terminals shown in black). The chip power supply terminal 31p of the processor 22p is arranged at a position (near the center) at which power can be appropriately supplied to a semiconductor die mounted on the processor 22p. However, the terminal arrangement is rearranged on the load chip module board 21, and in the load chip module 20, the first power supply input terminal group 31 is arranged so as to be continuously arranged up to the outermost peripheral terminals.

By connecting semiconductor elements on a supporting board such as the load chip module board 21, terminals connected only between those semiconductor elements can be reduced from the terminals (the connection terminal 3 and the load side connection terminal 23) of the multi-chip module. By reducing the total number of terminals, the terminals can be arranged more appropriately in the multi-chip module. For example, the load chip module 20 illustrated in FIG. 6 includes the processor 22p and the memory 22m. In many cases, the number of terminals connected to the memory 22m in the processor 22p is large because the terminals include bus signals such as an address bus and a data bus. When the processor 22p and the memory 22m are connected on the load chip module board 21, such a bus signal terminal can be omitted from the load side connection terminal 23 of the load chip module 20. Thus, the arrangement of the power input terminals can be easily rearranged as described above.

Although detailed description is omitted, the same applies to the power supply chip module 10. The terminal arrangement of the power supply semiconductor chip 2 is determined by the vendor of the power supply semiconductor chip 2 and may not be an optimal arrangement for mounting on the system board 30. However, by performing rearrangement in the power supply chip module board 1, the terminal arrangement of the power supply output terminals (the first power supply output terminal group 11 and the second power supply output terminal group 12) of the power supply chip module 10 can be optimized.

When the power supply chip module 10 and the load chip module 20 as described above are mounted on the system board 30 to configure the circuit module 80, the power supply chip module 10 and the load chip module 20 can be connected on the surface wiring layer of the system board 30 (the wiring layer of the system board first surface 30a and the wiring layer of the system board second surface 30b), as shown in FIGS. 7 to 9. That is, since it is not necessary to supply power using the inner wiring layer of the system board 30, the cost of the system board 30 can be reduced.

FIG. 7 schematically shows an example of a land and a power supply wiring pattern of the system board first surface 30a, and FIG. 8 schematically shows an example of a land and a power supply wiring pattern on the system board second surface 30b. In FIGS. 7 and 8, each large circle indicated by a broken line or by being colored in indicates a mounting land to which the connection terminal 3 and the load side connection terminal 23 are connected, and each small circle indicated by a solid line and a broken line indicates a through hole TH. A reference symbol "L11" indicates a mounting land to which the first power supply output terminal group 11 is connected, a reference numeral "L12" indicates a mounting land to which the second power supply output terminal group 12 is connected, and a reference numeral "L31" indicates a mounting land to which the first power supply input terminal group 31 is connected, and a reference numeral "L32" indicates a mounting land to which the second power supply input terminal group 32 is connected. An annular insulating region S is formed between the first power supply wiring pattern 41 and the mounting land "L32" to which the second power supply input terminal group 32 is connected.

As shown in FIG. 7, the land to which a specific terminal group 31S of the first power supply input terminal group 31 is connected is provided in a specific land region R31S. The first power supply wiring pattern 41 connecting the first power supply output terminal group 11 and the first power supply input terminal group 31 has a length of "W11" along the arrangement direction L1 at a part connected to the first power supply output terminal group 11 (part corresponding to an outer edge portion of the load side connection terminals 23 arranged in a rectangular annular shape) and has a length of "W31" along the load side arrangement direction L2 at a part connected to the first power supply input terminal group 31. Between the power supply chip module 10 and the load chip module 20, the first power supply wiring pattern 41 has a wiring width of "W41".

Although "W11", "W31", and "W41" have the same length in FIG. 7, they may be different. However, as described below with reference to FIG. 15, it is preferable that at least "W11≥W31". That is, in the system board 30, it is preferable that the wiring width "W31" along the arrangement direction (load side arrangement direction L2) of the specific terminal group (31S) of the wiring pattern (first power supply wiring pattern 41) to which the specific terminal group 31S is connected be equal to or less than the wiring width "W11" along the arrangement direction L1 of the first power supply output terminal group 11 of the wiring pattern (first power supply wiring pattern 41) to which the first power supply output terminal group 11 is connected.

Similarly, as shown in FIG. 8, the second power supply wiring pattern 42 connecting the second power supply output terminal group 12 and the second power supply input terminal group 32 has a length of "W12" along the arrangement direction L1 at a part connected to the second power supply output terminal group 12, and has a length of "W32" along the load side arrangement direction L2 on the load chip module 20 (a part corresponding to the outer edge portion of the load side connection terminals 23 arranged in a rectangular annular shape). The second power supply wiring pattern 42 has a wiring width of "W42" between the power supply chip module 10 and the load chip module 20. Although FIG. 8 shows as an example, a form in which "W12", "W32", and "W42" have the same length, they may be different. However, it is preferable that at least "W12≥W32".

The load chip module 20 is provided with a power input terminal group having an appropriate number of terminals in accordance with the current consumption of the load chip module 20. In contrast, the power supply chip module 10 is provided with a power supply output terminal group having an appropriate number of terminals so that the maximum current can be output within the output range of the power supply chip module 10. As a matter of course, in the circuit module 80, the power supply chip module 10 used has a specification in which the current can be sufficiently supplied even when the current consumption of the load chip module 20 is the maximum. In other words, the maximum value of the current consumption of the load chip module 20 is smaller than the maximum value of the output current of the power supply chip module 10. Thus, the effective sectional area of the wiring connected to the power input terminal group may be equal to or smaller than the effective sectional area of the wiring connected to the power output terminal group.

In the present embodiment, the first power supply wiring pattern 41 is a surface layer wiring pattern on the system board first surface 30a, and the second power supply wiring pattern 42 is a surface layer wiring pattern on the system board second surface 30b. Thus, the effective sectional area of the first power supply wiring pattern 41 and the effective sectional area of the second power supply wiring pattern 42 can be defined by the respective wiring widths. As described above, the effective cross-sectional area of the wiring connected to the power supply input terminal group may be smaller than the effective cross-sectional area of the wiring connected to the power supply output terminal group. Thus, the wiring width of the power supply wiring pattern at the part at which the power supply input terminal group is connected may be equal to or smaller than the wiring width of the power supply wiring pattern at the part at which the power supply output terminal group is connected.

Specifically, as shown in FIG. 7, in the first power supply input terminal group 31, the wiring width W31 of the first power supply wiring pattern 41 at the part at which the specific terminal group 31S is connected (an outer edge portion of the load side connection terminal 23 arranged in a rectangular annular shape) may be equal to or smaller than the wiring width W11 of the first power supply wiring pattern 41 at the part at which the first power supply output terminal group 11 is connected. Further, as shown in FIG. 8, the wiring width W32 of the second power supply wiring pattern 42 at the outer edge portion of the load side connection terminals 23 arranged in a rectangular annular shape may be equal to or less than the wiring width W12 of the second power supply wiring pattern 42 at the part at which the first power supply output terminal group 11 is connected.

Such a wiring width can be defined as follows based on the length of the region in which the power supply input terminal group and the power supply output terminal group are arranged. That is, the length W21 (see FIG. 3) along the load side arrangement direction L2 of the load side first region R21 (the specific land region R31S to which the specific terminal group 31S is connected (see FIG. 7)) in which the first power supply input terminal group 31 is arranged is equal to or less than the length W1 (see FIG. 2) of the first region R1 in which the first power supply output terminal group 11 is arranged. Further, the length W22 (see FIG. 3) along the load side arrangement direction L2 of the load side second region R22 in which the second power supply input terminal group 32 is arranged is equal to or less than the length W2 (see FIG. 2) of the first region R1 in which the second power supply output terminal group 12 is arranged.

FIG. 9 is a schematic cross-sectional view taken along the Y direction of the circuit module 80 shown in FIG. 1, and indicates the first power supply wiring pattern 41 and the second power supply wiring pattern 42 that are shown as an example in FIGS. 7 and 8 and that include the path passing through a through hole TH. As shown in FIGS. 1 and 9, the power supply chip module 10 and the load chip module 20 are supported on the same surface (here, the system board first surface 30a) of the system board 30, and are arranged so that the outermost peripheral row G1 in which the power supply output terminal group (here, the first power supply output terminal group 11) is arranged and the specific row SG face each other in the Z direction orthogonal to the board surface of the system board 30. Then, as described above with reference to FIGS. 2 and 3, the first power supply output terminal group 11 is arranged in the outermost peripheral row G1, and the second power supply output terminal group 12 is arranged on the inner side of the outermost peripheral row G1. The first power supply input terminal group 31 is arranged in the specific row SG, and the second power supply input terminal group 32 is arranged on the inner side of the specific row SG.

As a result, as shown in FIGS. 7 to 9, in one wiring layer of the system board 30, the first power supply output terminal group 11 and the first power supply input terminal group 31 are connected, and in another one wiring layer, the second power supply output terminal group 12 and the second power supply input terminal group 32 can be connected. As described above, when the specific row SG is included in the outermost peripheral row G1 of the load chip module 20, in the surface wiring layer (specific surface wiring layer 30y) of the support surface (system board first surface 30a) that supports the power supply chip module 10 and the load chip module 20 in the system board 30, the first power supply wiring pattern 41 can connect the first power supply output terminal group 11 and the first power supply input terminal group 31. Further, another wiring layer in which the second power supply wiring pattern 42 that connects the second power supply output terminal group 12 and the second power supply input terminal group 32 is formed is set as the surface wiring layer on a rear surface of the supporting surface (system board second surface 30b). In such a case, the power supply chip module 10 and the load chip module 20 can be appropriately connected by the system board 30 having the two wiring layers.

As a matter of course, the wiring layer in which the second power supply wiring pattern 42 is formed may be an inner wiring layer as illustrated in FIG. 12 instead of the surface wiring layer. Although not shown, when the specific row SG is not included in the outermost peripheral row G1 of the load chip module 20, the first power supply wiring pattern 41 that connects the first power supply output terminal group 11 and the first power supply input terminal group 31 may be formed in the inner wiring layer. Similarly, when the first power supply output terminal group 11 is not arranged in the outermost peripheral row G1, the first power supply wiring pattern 41 may be formed in the inner wiring layer, although not shown. Also in these cases, if the second power supply wiring pattern 42 is formed on the surface wiring layer, for example, the power supply chip module 10 and the load chip module 20 can be appropriately connected by the system board 30 having three wiring layers.

FIG. 10 shows another arrangement example of the power supply output terminals of the power supply chip module 10, and FIG. 11 shows another configuration example of the circuit module 80 using the power supply chip module 10 illustrated in FIG. 10. The form described above with reference to FIGS. 1 to 9 indicates as an example, the form in which the first power supply output terminal group 11 is arranged in the outermost peripheral row G1, and the second power supply output terminal group 12 is arranged in the inner peripheral row G2 on the inner side of the outermost peripheral row G1. On the contrary, FIG. 10 illustrates as an example, a form in which the second power supply output terminal group 12 is arranged in the outermost peripheral row G1 and the first power supply output terminal group 11 is arranged in the inner peripheral row G2 on the inner side of the outermost peripheral row G1. The arrangement of the first power supply input terminal group 31 and the second power supply input terminal group 32 of the load chip module 20 is the same as the form described with reference to FIGS. 1 to 9. Further, FIG. 11 is a schematic cross-sectional view of the circuit module 80 similar to FIG. 9, and shows the first power supply wiring pattern 41 and the second power supply wiring pattern 42 that connect the load chip module 20 and the power supply chip module 10 indicated as an example in FIG. 10 and that include the path that passes through the through hole TH.

As shown in FIG. 11, the power supply chip module 10 and the load chip module 20 are supported respectively, by the surfaces of the system board 30 that face opposite sides. Here, an example is shown in which the power supply chip module 10 in FIG. 10 is supported on the system board first surface 30a and the load chip module 20 is supported on the system board second surface 30b. The power supply chip module 10 and the load chip module 20 are arranged such that the outermost peripheral row G1 in which the power supply output terminal group (here, the second power supply output terminal group 12) and the row SG are opposed to each other when viewed in the Z direction orthogonal to the board surface of the system board 30, and the power supply chip module 10 and the load chip module 20 are arranged so as not to overlap.

Since the power supply chip module 10 and the load chip module 20 are supported on different surfaces of the system board 30, the power supply chip module 10 and the load chip module 20 can be arranged so as to overlap with each other when viewed in the Z direction. However, in general, the power supply chip module 10 often consumes a large amount of current and generates a large amount of heat. Further, when the operating frequency of the processor 22p included in the load chip module 20 is also high and the calculation load is also high, heat generation may be increased. Thus, the power supply chip module 10 and the load chip module 20 are arranged on the system board 30 so that they do not overlap in the Z direction to suppress radiation heat from the power supply chip module 10 from being transmitted to the load chip module 20, while heat dissipation of the power supply chip module 10 and the load chip module 20 are also taken into consideration.

As described above with reference to FIG. 10, the first power supply output terminal group 11 is arranged in the outermost peripheral row G1, and the second power supply output terminal group 12 is arranged on the inner side of the outermost peripheral row G1. Further, as described above with reference to FIG. 3, the first power supply input terminal group 31 is arranged in the specific row SG, and the second power supply input terminal group 32 is arranged on the inner side of the specific row SG. As a result, as shown in FIG. 11, the first power supply output terminal group 11 and the first power supply input terminal group 31 can be connected in one wiring layer of the system board 30, and the second power supply output terminal group 12 and the second power supply input terminal group 32 can be connected in another wiring layer.

Also in this case, when the specific row SG is included in the outermost peripheral row G1 of the load chip module 20, the first power supply output terminal group 11 and the first power supply input terminal group 31 can be connected by the first power supply wiring pattern 41, in the surface wiring layer (specific surface wiring layer 30y) on the system board second surface 30b that supports the load chip module 20 in the system board 30. Another wiring layer in which the second power supply wiring pattern 42 that connects the second power supply output terminal group 12 and the second power supply input terminal group 32 is formed can be set as the surface wiring layer on the system board first surface 30a that supports the power supply chip module 10 on the rear surface of the system board second surface 30b. In this case, the power supply chip module 10 and the load chip module (20) can be appropriately connected by the system board 30 having the two wiring layers.

Although not shown, as a matter of course, the wiring layer in which the second power supply wiring pattern 42 is formed may be the inner wiring layer as illustrated in FIG. 12 instead of the surface wiring layer. Although not shown, when the specific row SG is not included in the outermost peripheral row G1 of the load chip module 20, the first power supply wiring pattern 41 that connects the first power supply output terminal group 11 and the first power supply input terminal group 31 may be formed in the inner wiring layer. Also in this case, for example, if the second power supply wiring pattern 42 is formed on the surface wiring layer, the power supply chip module 10 and the load chip module 20 can be appropriately connected by the system board 30 having three wiring layers. Similarly, although not shown, when the second power supply output terminal group 12 is not arranged in the outermost peripheral row G1 (in the case of the terminals shown in FIG. 2 instead of the terminal arrangement shown in FIG. 10), the second power supply wiring pattern 42 may be formed in the inner wiring layer. Also in this case, for example, if the first power supply wiring pattern 41 is formed in the surface wiring layer, the power supply chip module 10 and the load chip module 20 can be appropriately connected by the system board 30 having three wiring layers.

In addition, here, with reference to FIGS. 10 and 11, a description has been given of the form in which the arrangement of the first power supply output terminal group 11 and the second power supply output terminal group 12 in the power supply chip module 10 are reversed. Similarly, in the load chip module 20, the arrangement of the first power supply input terminal group 31 and the second power supply input terminal group 32 can be reversed. Since such a form can be modified easily according to the above description with reference to FIGS. 1 to 12, detailed description thereof will be omitted.

As described above with reference to FIGS. 1 to 12, the circuit module 80 has the following configuration as a preferred form. The system board 30 includes the first power supply wiring pattern 41 formed on the specific surface wiring layer 30y which is one of the surface wiring layers of the system board 30, and the second power supply wiring pattern 42 formed in a wiring layer different from the specific surface wiring layer 30y, as the power supply path connecting the power supply chip module 10 and the load chip module 20. The power supply output terminal group includes the first power supply output terminal group 11 connected to the first power supply wiring pattern 41 and the second power supply output terminal group 12 connected to the second power supply wiring pattern 42. The power supply terminal group includes the first power supply input terminal group 31 that includes the specific terminal group 31S and that is connected to the first power supply wiring pattern 41, and the second power supply input terminal group 32 connected to the second power supply wiring pattern 42. The wiring width (W42) of the second power supply wiring pattern 42 is broader than the wiring width (W41) of the first wiring pattern (41) (see FIGS. 7 and 8). The wiring width W11 of the first power supply wiring pattern 41 at the part in which the first power supply output terminal group 11 is connected is equal to or larger than the wiring width W31 of the first power supply wiring pattern 41 on the load chip module 20 side (see FIG. 7). Further, the wiring width W42 of the second power supply wiring pattern 42 at the part in which the second power supply output terminal group 12 is connected is equal to or larger than the wiring width W32 of the second power supply wiring pattern 42 on the load chip module 20 side.

In addition, as described above with reference to FIGS. 1, 9, 12, etc., when the power supply chip module 10 and the load chip module 20 are supported on the same surface of the system board 30 and are arranged so that the row in which the power supply output terminal groups (11, 12) is arranged and the specific row SG face each other when viewed in the Z direction, it is preferable that the first power supply output terminal group 11 be arranged in the row on the outer peripheral side of the second power supply output terminal group 12 and the first power supply input terminal group 31 be arranged on the outer peripheral side of the second power supply input terminal group 32. In addition, as described above with reference to FIGS. 10 and 11, the power supply chip module 10 and the load chip module 20 are respectively supported on the surfaces of the system board 30 facing opposite sides from each other, the rows in which the power supply output terminal groups (11, 12) are arranged face the specific row SG when viewed in the Z direction, and the power supply chip module 10 and the load chip module 20 are arranged so as to not overlap with each other. In such a case, it is preferable that the first power supply output terminal group 11 be arranged in the row on the inner circumference side of the second power supply output terminal group 12, and the first power supply input terminal group 31 be arranged in the row on the outer circumference side of the second power supply input terminal group.

In the above description with reference to FIGS. 1 to 12, the form is shown as an example in which the power supply output terminal group includes the first power supply output terminal group 11 and the second power supply output terminal group 12, the power supply input terminal group includes the first power supply input terminal group 31 and the second power supply input terminal group 32, and the power sources of two systems are connected by the wiring patterns of two systems (the first power supply wiring pattern 41 and the second power supply wiring pattern 42).

However, as illustrated in FIGS. 13 and 14, the form may be such that the power supply output terminal group is only the first power supply output terminal group 11, the power supply input terminal group is the first power supply input terminal group 31, and the power source of one system is connected via the wiring pattern (for example, the first power supply wiring pattern 41) of one system.

That is, the form may be as follows. The connection terminals 3 include the power supply output terminal group (first power supply output terminal group 11) having the terminals. The load side connection terminals (23) include the power supply input terminal group (first power supply input terminal group 31) having the terminals connected to the power supply output terminal group. The power supply output terminal group is arranged side by side in a row along at least one side of the power supply chip module board 1. The power supply input terminal group has the specific terminal group 31S that is arranged side by side in the specific row SG that is the row along at least one side of the load chip module board 21. The wiring width (W31) along the load side arrangement direction L2 of the specific terminal group 31S of the wiring pattern (first power supply wiring pattern 41) in which the specific terminal group 31S is connected to the system board 30 in the specific row SG is equal to less than the wiring width (W11) along the arrangement direction L1 of the power supply output terminal group of the wiring pattern (first power supply wiring pattern 41) in which the power output terminal group is connected to the system board.

In FIG. 13, similar to FIG. 9, a case is shown in which the power supply chip module 10 and the load chip module 20 are arranged such that the power supply chip module 10 and the load chip module 20 are supported on the same surface of the system board 30, and the row in which the power supply output terminal group (first power supply output terminal group 11) is arranged and the specific row SG are arranged so as to face each other when viewed in the Z direction. As shown in FIG. 13, when the specific row SG is included in the outermost periphery of the load chip module 20, the power supply output terminal group (first power supply output terminal group 11) and the power supply input terminal group (first power supply input terminal group 31) can be connected by the power supply path (first power supply wiring pattern 41) formed in the surface wiring layer (specific surface wiring layer 30y) on the supporting surface (system board first surface 30a) that supports the power supply chip module 10 and the load chip module 20 in the system board 30. That is, the power supply chip module 10 and the load chip module 20 can be appropriately connected by the system board 30 having at least the specific surface wiring layer 30y (having one wiring layer).

Although not shown, as a matter of course, the wiring layer on which the first power supply wiring pattern 41 is formed may be the surface wiring layer on the rear surface (system board second surface 30b) of the supporting surface (system board first surface 30a) instead of the specific surface wiring layer 30y. In this case, the power supply chip module 10 and the load chip module 20 can be connected with the system board 30 having two layers of the wiring layer that are the surface wiring layer (specific surface wiring layer 30y) for mounting the power supply chip module 10 and the load chip module 20 on the system board first surface 30a, and having the surface wiring layer for forming the power supply path (first power supply wiring pattern 41) on the system board second surface 30b. Similarly, although not shown and not described, the first power supply wiring pattern 41 may be formed in the inner wiring layer. In this case, the power supply chip module 10 and the load chip module 20 can be appropriately connected by the system board 30 having three wiring layers.

In FIG. 14, similar to FIG. 11, shown is the case in which the power supply chip module 10 and the load chip module 20 are respectively supported on the surfaces of the system board 30 facing opposite sides, and the row in which the power supply output terminal group (first power supply output terminal group 11) is arranged and the specific row SG face each other when viewed in the Z direction, and the power supply chip module 10 and the load chip module 20 are arranged so as not to overlap. As shown in FIG. 14, when the specific row SG is included in the outermost periphery of the load chip module 20, the power supply output terminal group (first power supply output terminal group 11) and the power supply input terminal group (first power supply input terminal group 31) can be connected by the power supply path (first power supply wiring pattern 41) formed in the surface wiring layer (specific surface wiring layer 30y) on the supporting surface (system board second surface 30b) that supports the load chip module 20 in the system board 30. That is, the power supply chip module 10 and the load chip module 20 can be appropriately connected by the surface wiring layer from mounting the power supply chip module 10 on the system board first surface 30a, and by the system board 30 on which the load chip module 20 is mounted on the system board second surface 30b and that has the two wiring layers including the surface wiring layer (specific surface wiring layer 30y) for forming the power supply path (first power supply wiring pattern 41).

In FIG. 14, similar to FIGS. 10 and 11, an example is shown in which the arrangement of the connection terminals in the power supply chip module 10 is such that the first power supply output terminal group 11 is not arranged in the outermost peripheral row G1. However, the form may be such that the first power supply output terminal group 11 is arranged in the outermost peripheral row G1, similar to FIGS. 2 and 9. Further, as a matter of course, the wiring layer on which the first power supply wiring pattern 41 is formed may be the surface wiring layer on the rear surface (system board first surface 30a) of the supporting surface (system board second surface 30b) of the load chip module 20, instead of the specific surface wiring layer 30y. Although not shown, for example, when the specific row SG is not included in the outermost peripheral row G1 of the load chip module 20, and the first power supply output terminal group 11 is arranged in the outermost peripheral row G1 of the power supply chip module 10, it is preferable that the first power supply wiring pattern 41 be formed in the surface wiring layer on the system board first surface 30a. Also in this case, the power supply chip module 10 and the load chip module 20 can be appropriately connected by the system board 30 having two wiring layers.

Similarly, although illustration and detailed description are omitted, the first power supply wiring pattern 41 may be formed in the inner wiring layer. For example, when the specific row SG is not included in the outermost peripheral row G1 of the load chip module 20 and the first power supply output terminal group 11 is also not arranged in the outermost peripheral row G1 of the power supply chip module 10, it is preferable that the first power supply wiring pattern 41 be formed in the inner wiring layer. In this case, the power supply chip module 10 and the load chip module 20 can be appropriately connected by the system board 30 having at least three wiring layers.

In the above description, referring to FIG. 7 and the like, a form is shown as an example in which the wiring width W11 along the arrangement direction L1 of the first power supply output terminal group 11 of the first power supply wiring pattern 41 in which the first power supply output terminal group 11 is connected to the system board 30 (the wiring pattern in which the power supply output terminal group is connected to the system board 30) is the same as the wiring width W31 along the arrangement direction L2 of the specific terminal group 31S of the first power supply wiring pattern 41 in which the specific terminal group 31S is connected to the system board 30 in the specific row.

Figure 15:
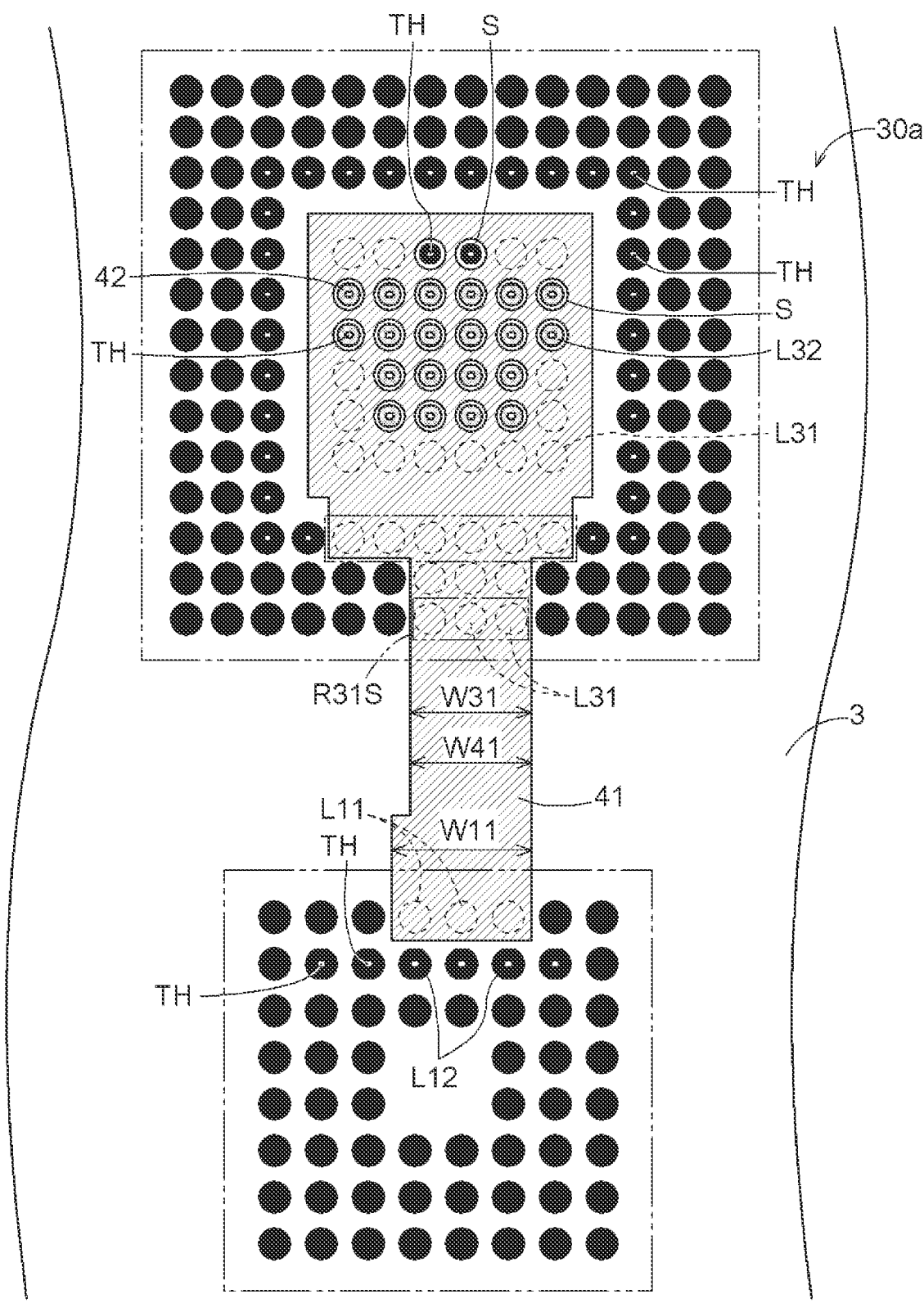
FIG. 15 is a diagram schematically showing another example of the wiring pattern of the power supply wiring on the first surface of the system board.

However, the load chip module 20 may have more input/output signals and more terminals than the power supply chip module 10. In this case, the terminals of the load chip module 20 are preferably arranged at a higher density than the terminals of the power supply chip module 10. Thus, the terminal interval (pin pitch) of the load chip module 20 tends to be narrower than the terminal interval of the power supply chip module 10. FIG. 7 illustrates as an example, a form in which the terminal interval of the power supply chip module 10 and the terminal interval of the load chip module 20 are the same, and the wiring width "W11" and the wiring width "W31" are the same. However, as shown in FIG. 15, when the terminal interval of the load chip module 20 is narrower than the terminal interval of the power supply chip module 10, the wiring width "W11" becomes wider than the wiring width "W31".

Thus, it is preferable that the wiring width W11, which is along the arrangement direction L1 of the first power supply output terminal group 11 of the first power supply wiring pattern 41 in which the first power supply output terminal group 11 is connected to the system board 30 (the wiring pattern in which the power supply output terminal group is connected to the system board 30), be equal to or more than the wiring width W31, which is along the arrangement direction L2 of the specific terminal group 31S of the first power supply wiring pattern 41 in which the specific terminal group 31S is connected to the system board 30 in the specific row.

In the above, the form in which the electric power of two systems can be supplied from the power supply chip module 10 to the load chip module 20 using two wiring layers (preferably two surface wiring layers) is described. Further, a form in which the electric power of one system can be supplied from the power supply chip module 10 to the load chip module 20 by using one wiring layer (preferably the surface wiring layer) is described. When supplying electric power from two systems, this is realized by the arrangement of the first power supply output terminal group 11 and the second power supply output terminal group 12 in the power supply chip module 10 (see FIGS. 2 and 10). When supplying electric power of one system, this is realized by the arrangement of the power supply output terminal group (first power supply output terminal group 11) in the power supply chip module 10 (analogous application of FIGS. 2 and 10). Hereinafter, the excellent configuration of the power supply chip module 10 according to the present embodiment will be described with reference to FIG. 16 showing a comparative example, with the case of supplying electric power of two systems serving as an example.

Similar to FIGS. 1 and 9, FIG. 16 schematically illustrates the first power supply wiring pattern 41 when the power supply chip module 10 and the load chip module 20 are supported on the system board first surface 30a that is the same surface of the system board 30. The arrangement of the first power supply input terminal group 31 of the load chip module 20 is as described above with reference to FIG. 3, etc. In contrast, although the numbers of connection terminals configuring the power supply output terminal group in the first power supply output terminal group 11 and the second power supply output terminal group 12 in the power supply chip module 10 are respectively the same as those in the form described with reference to FIGS. 2 and 10, the arrangement direction is different. In the form described above with reference to FIGS. 2 and 10, etc., the first power supply output terminal group 11 and the second power supply output terminal group 12 are arranged along the arrangement direction L1 along the side of the power supply chip module board 1 having a rectangular shape. However, in the comparative example shown in FIG. 16, the first power supply output terminal group 11 is arranged in a line in the LX direction orthogonal to the arrangement direction L1. The second power supply output terminal group 12 is arranged in two rows in the LX direction.

That is, the first power supply output terminal group 11 and the second power supply output terminal group 12 are arranged side by side from the center of the power supply semiconductor chip 2 toward the outer peripheral side. Thus, in the comparative example, a length (WV) along the arrangement direction L1 of the first region R1 in which the first power supply output terminal group 11 is arranged is the same as the length (W1) along the arrangement direction L1 in the embodiment described above with reference to FIG. 2, etc. In the embodiment described above with reference to FIG. 2 and the like, the three connection terminals 3 are arranged along the arrangement direction L1. However, in the comparative example, the number of the connection terminals 3 along the arrangement direction L1 is one, and the length of the first region R1 along the arrangement direction L1 is approximately one third. Thus, in the comparative example shown in FIG. 16, the wiring width W11 of the first power supply wiring pattern 41 at the part in which the first power supply output terminal group 11 is connected is short and the effective sectional area of the first power supply wiring pattern 41 is also narrow compared to the embodiment described above with reference to FIG. 7.

As a method of increasing the effective sectional area of the first power supply wiring pattern 41 in the comparative example, it is conceivable to use a wiring layer other than the surface wiring layer. In order to ensure an effective sectional area equivalent to that of the embodiment described above with reference to FIG. 7 by using another wiring layer with the same wiring width as the first power supply wiring pattern 41 on the system board first surface 30a, it is necessary to use two other wiring layers. For example, it is necessary to use a wiring layer on the system board second surface 30b and an inner wiring layer (not shown). As described above with reference to FIGS. 9 and 11, when the specific row SG of the load chip module 20 is included in the outermost peripheral row G1, the system board 30 can be configured by a board having at least two layers of wiring lines. However, the comparative example requires three wiring layers.

Regarding the second power supply output terminal group 12 as well, in the form described above with reference to FIG. 2 and the like, the six connection terminals 3 are arranged along the arrangement direction L1. However, in the comparative example, the number of connection terminals 3 along the arrangement direction L1 is two, and the length of the second region R2 along the arrangement direction L1 is approximately one third. Thus, similar to the first power supply wiring pattern 41, in the comparative example shown in FIG. 16, the length is shorter and the effective sectional area of the second power supply wiring pattern 42 is narrower than in the embodiment described above with reference to FIG. 8. Thus, it is necessary to use another wiring layer for the second power supply wiring pattern 42 as well, which may increase the cost of the system board 30.

In contrast, as described above with reference to FIGS. 1 to 15, in the present embodiment, it is possible to ensure a sufficient wiring width in a surface direction of the system board 30 on which the power supply chip module 10 is mounted, and it is possible to ensure a sufficient effective sectional area. Thus, it is not necessary to increase the effective cross-sectional area of the wiring in the thickness direction of the board, and it is possible to restrict the wiring layer (inner wiring layer) of the system board 30 from increasing.

Summary of Embodiment

The summary of the power supply chip module (10) and the circuit module (80) described above will be briefly described below.

As one aspect, a circuit module (80) includes: a power supply chip module (10) including a power supply chip module board (1) that has a rectangular plate shape, at least one power supply semiconductor chip (2) that is supported on an upper surface (1a) of the power supply chip module board (1), and a plurality of connection terminals (3) that is arranged in a plurality of rows in a rectangular annular shape along each side of the power supply chip module board (1) on a lower surface (1b) of the power supply chip module board (1) and that is electrically connected to the power supply semiconductor chip (2); a load chip module (20) including a load chip module board (21) that has a rectangular plate shape, at least one load semiconductor chip (22) that is supported on an upper surface (21a) of the load chip module board (21), and a plurality of load side connection terminals (23) that is arranged in a plurality of rows in a rectangular annular shape along each side of the load chip module board (21) on a lower surface (21b) of the load chip module board (21) and that is electrically connected to the load semiconductor chip (22); and system board (30) that supports the power supply chip module (10) and the load chip module (20), wherein a power supply output terminal group (11) having a plurality of terminals (3) is included in the connection terminals, a power supply input terminal group (31) having a plurality of terminals connected to the power supply output terminal group (11) is included in the load side connection terminals (23), the power supply output terminal group (11) is arranged side by side in a row along at least one side of the power supply chip module board (1), the power supply input terminal group (31) includes a specific terminal group (31S) arranged in a specific row (SG) that is a row along at least one side of the load chip module board (21), and wiring width (W11) along an arrangement direction (L1) of the power supply output terminal group (11) of a wiring pattern (41) in which the power supply output terminal group (11) is connected to the system board (30) is equal to or more than a wiring width (W31) along an arrangement direction (L2) of the specific terminal group (31S) of the wiring pattern (41) in which the specific terminal group (31S) is connected to the system board (30).

The load chip module (20) is provided with the power input terminal group having an appropriate number of terminals in accordance with the current consumption of the load chip module (20). In contrast, the power supply chip module (10) is provided with the power supply output terminal group in with the appropriate number of terminals so that the power supply chip module (10) can output the maximum current within the possible output range. As a matter of course, the power supply chip module (10) used has a specification in which current can be sufficiently supplied even when the consumption current of the load chip module (20) is the maximum. In other words, the maximum value of the consumption current of the load chip module (20) is smaller than the maximum value of the output current of the power supply chip module (10). Thus, the effective sectional area of the wiring connected to the power supply input terminal group may be smaller than the effective sectional area of the wiring connected to the power supply output terminal group. According to the present configuration, the wiring width (W11) of the wiring pattern to which the power output terminal group is connected is equal to or larger than the wiring width (W31) of the wiring pattern to which the power supply input terminal group is connected. Thus, the power supply chip module (10) and the load chip module (80) can be connected appropriately.

Here, it is preferable that the system board (30) have a first wiring pattern (41) formed on a specific surface wiring layer (30y), which is one surface wiring layer of the system board (30), and a second wiring pattern (42) formed on a different wiring layer from the specific surface wiring layer (30y), as a power supply path connecting the power supply chip module (10) and the load chip module (20), the power supply output terminal group include a first power supply output terminal group (11) connected to the first wiring pattern (41) and a second power supply output terminal group (12) connected to the second wiring pattern (42), the power supply input terminal group include a first power supply input terminal group (31) that includes the specific terminal group (31S) and that is connected to the first wiring pattern (41), and a second power supply input terminal group (32) that is connected to the second wiring pattern (42), a wiring width (W42) of the second wiring pattern (42) be broader than a wiring width (W41) of the first wiring pattern (41), the wiring width (W11) of the first wiring pattern (41) at a part in which the first power supply output terminal group (11) is connected be equal to or more than the wiring width (W31) of the first wiring pattern (41) on a side of the load chip module (20), and the wiring width (W42) of the second wiring pattern (42) at a part in which the second power supply output terminal group (12) is connected be equal to or more than the wiring width (W32) of the second wiring pattern (42) on the side of the load chip module (20).

As described above, the maximum value of the consumption current of the load chip module (20) is smaller than the maximum value of the output current of the power supply chip module (10). Thus, the effective sectional area of the wiring connected to the power supply input terminal group may be smaller than the effective sectional area of the wiring connected to the power supply output terminal group. According to the present configuration, the lengths (W21, W22) of the regions in which the power supply input terminal groups are arranged are less than or equal to the lengths (W1, W2) of the regions in which the corresponding power supply output terminal groups are arranged. Thus, the power supply chip module (10) and the load chip module (80) can be appropriately connected.

It is preferable that the power supply chip module (10) and the load chip module (20) be supported on the same surface of the system board (30), and be arranged so that a row in which the power supply output terminal group (11, 12) is arranged and the specific row (SG) face each other when viewed in a direction (Z) orthogonal to a board surface of the system board (30), the first power supply output terminal group (11) be arranged in a row on an outer peripheral side of the second power supply output terminal group (12), and the first power supply input terminal group (31) be arranged in a row on the outer peripheral side of the second power supply input terminal group (32).

According to this configuration, in the specific surface wiring layer (30y) of the system board (30), the first power supply output terminal group (11) and the first power supply input terminal group (31) can be connected, and in another wiring layer, the second power supply output terminal group (12) and the second power supply input terminal group (32) can be connected. The other wiring layer that connects the second power supply output terminal group (12) and the second power supply input terminal group (32) can be set as the surface wiring layer on the rear surface (30b) of the supporting surface (30a) on which the specific surface wiring layer (30y) is formed. In this case, the power supply chip module (10) and the load chip module (20) can be appropriately connected by the system board (30) having two wiring layers. The other wiring layer that connects the second power supply output terminal group (12) and the second power supply input terminal group (32) can be formed in the inner wiring layer instead of the surface wiring layer on the rear surface (30b). Even in this case, the power supply chip module (10) and the load chip module (20) can be appropriately connected by the system board (30) having three wiring layers, for example.

It is preferable that the power supply chip module (10) and the load chip module (20) be respectively supported on surfaces of the system board (30) that face opposite sides, and the power supply chip module (10) and the load chip module (20) be arranged so that a row in which the power supply output terminal group (11, 12) is arranged and the specific row (SG) face each other and the power supply chip module (10) and the load chip module (20) do not overlap with each other when viewed in a direction (Z) orthogonal to a board surface of the system board (30), the first power supply output terminal group (11) be arranged in a row on an inner peripheral side of the second power supply output terminal group (12), and the first power supply input terminal group (31) be arranged in a row on the outer peripheral side of the second power supply input terminal group (32).

Similar to the above, with this configuration, the first power supply output terminal group (11) and the first power supply input terminal group (31) can be connected using the specific surface wiring layer (30y) of the system board (30), and the second power supply output terminal group (12) and the second power supply input terminal group (32) can be connected using another one wiring layer. The other wiring layer that connects the second power supply output terminal group (12) and the second power supply input terminal group (32) can be set as the surface wiring layer on the rear surface (30a) of the surface (30b) on which the specific surface wiring layer (30y) is formed. In this case, the power supply chip module (10) and the load chip module (20) can be appropriately connected by the system board (30) having two wiring layers. The other wiring layer that connects the second power supply output terminal group (12) and the second power supply input terminal group (32) can be the inner wiring layer instead of the surface wiring layer on the rear surface (30a) of the surface (30b) on which the specific surface wiring layer (30y) is formed. Even in this case, the power supply chip module (10) and the load chip module (20) can be appropriately connected by the system board (30) having three wiring layers, for example.

As one aspect, a power supply chip module (10) includes: a power supply chip module board (1) that has a rectangular plate shape; at least one a power supply semiconductor chip (2) that is supported on an upper surface (1a) of the power supply chip module board (1); and a plurality of connection terminals (3) that is arranged in a rectangular annular shape along each side of the power supply chip module board (1) on a lower surface (1b) of the power supply chip module board (1) and that is electrically connected to the power supply semiconductor chip (2), in which the connection terminals (3) include a first power supply output terminal group (11) having a plurality of terminals that outputs a first voltage and a second power supply output terminal group (12) having a plurality of terminals that outputs a second voltage, one power supply output terminal group of the first power supply output terminal group (11) and the second power supply output terminal group (12) is arranged in an outermost peripheral row (G1) that is an outermost peripheral row along at least one side of the power supply chip module board (1), the other power supply output terminal group of the first power supply output terminal group (11) and the second power supply output terminal group (12) is arranged along an arrangement direction (L1) of the power supply output terminal group in the outermost peripheral row (SG), in one inner peripheral row (G2) that is an inner row of the outermost peripheral row (G1), and first region (R1) in which the first power supply output terminal group (11) is arranged and a second region (R2) in which the second power supply output terminal group (12) is arranged are at least partially overlapped, when viewed in a direction (LX) that is along the power supply chip module board (1) and that is orthogonal to the arrangement direction (L1).

According to this configuration, the power supply output terminal groups that are arranged side by side in the outermost peripheral row (G1) and the power supply destination of the power supply output terminal group can be connected by the surface layer wiring formed on the mounting surface of the board on which the power supply chip module (10) is mounted. Further, since the power supply output terminal groups arranged side by side in the outermost peripheral row (G1) are adjacent to each other in the circumferential direction of the connection terminals (3) arranged in a rectangular annular shape, it is possible to provide the surface layer wiring in which there is a sufficient wiring width in the direction along the arrangement direction (L1) and in which a wiring impedance is suppressed. Since the power supply output terminal group arranged in the inner peripheral row (G2) is at least partially overlapped with the power supply output terminal group arranged in the outermost peripheral row (G1) when viewed in the arrangement direction (LX) orthogonal to the arrangement direction (L1), it is difficult for the power supply output terminal group arranged in the inner peripheral row (G2) to connect the power supply output terminal group to the power supply destination with the surface layer wiring on the mounting surface as described above. However, with the wiring provided on another wiring layer other than the surface wiring on the mounting surface of the board, the power supply output terminal group arranged in the inner peripheral row can be appropriately connected to the power supply destination. That is, since a sufficient wiring width can be secured in the surface direction of the board on which the power supply chip module (10) is mounted, and a sufficient effective sectional area of the wiring can be secured, there is no need to increase the effective region in the thickness direction of the board. Thus, it is possible to suppress an increase in the wiring layer (inner wiring layer) of the board. As described above, according to the present configuration, it is possible to appropriately connect the power supply source and the power supply destination while suppressing an increase in the wiring layer of the mounting board.

Here, it is preferable that among the first power supply output terminal group (11) and the second power supply output terminal group (12), the terminal group with more terminals be set as a many-terminal group and the terminal group with less terminals be set as a few-terminal group, and an entire region in which the few-terminal group is arranged along the arrangement direction (L1) overlap with a region in which the many-terminal group is arranged along the arrangement direction (L1), when viewed along the arrangement direction that is along the power supply chip module board (1) and that is orthogonal to the arrangement direction (L1).

The connection terminals (3) arranged in a plurality of rows in a rectangular annular shape include signal input/output terminals. However, there is a case in which the wiring connected to the power supply output terminal group and the power supply output terminal group prevents the wiring path from the input terminal of the signal from the center portion of the power supply chip module (10) to the outer peripheral side from being laid, on the mounting surface of the board on which the power supply chip module (10) is mounted. According to the present configuration, since the entire region in which the few-terminal group is arranged overlaps with the region in which the many-terminal group is arranged, it is possible to reduce the possibility that the wiring path from the signal input terminal is prevented from being laid and to easily secure the wiring path.

It is preferable that a circuit module (80) include: the power supply chip module (10) described above; and a load chip module (20) connected to the power supply chip module (10), in which the load chip module (20) include a load chip module board (21) that has a rectangular plate shape, at least one load semiconductor chip (22) that is supported on an upper surface (21a) of the load chip module board (21), and a plurality of load side connection terminals (23) that is arranged in a plurality of rows in a rectangular annular shape along each side of the load chip module board (21) on a lower surface (21b) of the load chip module board (21) and that is electrically connected to the load semiconductor chip (22), included in the load side connection terminals (23) as a power supply input terminal group be a first power supply input terminal group (31) having a plurality of terminals connected to the first power supply output terminal group (11) and a second power supply input terminal group (32) having a plurality of terminal connected to the second power supply output terminal group (12), a region in which the first power supply input terminal group (31) is arranged be set as a load side first region (R21), and a region in which the second power supply input terminal group (32) be arranged is set as a load side second region (R22), in a row closest to the outermost peripheral row, an arrangement direction of the power supply input terminal group that is arranged along at least one side of the load chip module board (21) be set as a load side arrangement direction (L2), and the first power supply input terminal group (31) be arranged so that a length (W21) of the load side first region in a direction along the load side arrangement direction (L2) is equal to or less than a length (W1) of the first region (R1) in a direction along the arrangement direction (L1), and the second power supply input terminal group (32) be arranged so that a length (W22) of the load side second region (R22) in the direction along the load side arrangement direction (L2) is equal to or less than a length (W2) of the second region (R2) in the direction along the arrangement direction (L1).

The load chip module (20) is provided with the power input terminal group having an appropriate number of terminals in accordance with the current consumption of the load chip module (20). In contrast, the power supply chip module (10) is provided with the power supply output terminal group in with the appropriate number of terminals so that the power supply chip module (10) can output the maximum current within the possible output range. As a matter of course, the power supply chip module (10) used has a specification in which current can be sufficiently supplied even when the consumption current of the load chip module (20) is the maximum. In other words, the maximum value of the consumption current of the load chip module (20) is smaller than the maximum value of the output current of the power supply chip module (10). Thus, the effective sectional area of the wiring connected to the power supply input terminal group may be smaller than the effective sectional area of the wiring connected to the power supply output terminal group. According to the present configuration, the lengths (W21, W22) of the regions in which the power supply input terminal groups are arranged are less than or equal to the lengths (W1, W2) of the regions in which the corresponding power supply output terminal groups are arranged. Thus, the power supply chip module (10) and the load chip module (80) can be appropriately connected.

Here, it is preferable that one of the first power supply input terminal group (31) and the second power supply input terminal group (32) be arranged in a specific row (SG) that is any one of a plurality of rows along the load side arrangement direction (L2), and the other one of the first power supply input terminal group (31) and the second power supply input terminal group (32) be arranged on an inner side of the specific row (SG).

Similar to the connection terminals (3) of the power supply chip module (10), the load side connection terminals (23) arranged in a plurality of rows in a rectangular annular shape also include signal input/output terminals. There is a case in which the power input terminal group and the wiring connected to the power input terminal group prevent the wiring path from the center portion of the load chip module (20) to the outer peripheral side from being laid, on the mounting surface of the board on which the load chip module (20) is mounted. However, according to the present configuration, the first power supply input terminal group (31) and the second power supply input terminal group (32) are arranged so that at least a part thereof overlaps in the direction orthogonal to the load side arrangement direction (L2). Thus, it is possible to reduce the possibility that the wiring path of the signal input/output terminal is prevented from being laid.

It is preferable that when one of the first power supply input terminal group (31) and the second power supply input terminal group (32) is arranged in the specific row (SG) and the other one is arranged on the inner side of the specific row (SG), the circuit module further include a system board (30) that supports the power supply chip module (10) and the load chip module (20), the power supply chip module (10) and the load chip module (20) be supported on the same surface of the system board (30), and be arranged so that the outermost peripheral row (G1) in which the power supply output terminal group is arranged and the specific row (SG) face each other when viewed in a direction (Z) orthogonal to a board surface of the system board (30), the first power supply output terminal group (11) be arranged in the outermost peripheral row (G1), the second power supply output terminal group (12) be arranged on an inner side of the outermost peripheral row (G1), the first power supply input terminal group (31) be arranged in the specific row (SG), and the second power supply input terminal group (32) be arranged on an inner side of the specific row (SG).

According to this configuration, the first power supply output terminal group (11) and the first power supply input terminal group (31) can be connected in one wiring layer of the system board (30), and the second power supply output terminal group (12) and the second power supply input terminal group (32) can be connected in another one wiring layer. When the specific row (SG) is included in the outermost peripheral row (G1) of the load chip module (20), the first power supply output terminal group (11) and the first power supply input terminal group (31) can be connected on the surface wiring layer of the supporting surface (30a) that supports the power supply chip module (10) and the load chip module (20) in the system board (30). Further, another wiring layer connecting the second power supply output terminal group (12) and the second power supply input terminal group (32) may be, for example, a surface wiring layer on the rear surface (30b) of the support surface (30a). In this case, the power supply chip module (10) and the load chip module (20) can be appropriately connected by the system board (30) having two wiring layers. When the specific row (SG) is not included in the outermost peripheral row (G1) of the load chip module (20), the first power supply output terminal group (11) and the first power supply input terminal group (31) are connected in the inner wiring layer. In this case, the power supply chip module (10) and the load chip module (20) can be appropriately connected by the system board (30) having three wiring layers, for example.

It is preferable that when one of the first power supply input terminal group (31) and the second power supply input terminal group (32) is arranged in the specific row (SG) and the other one is arranged on the inner side of the specific row (SG), the circuit module further include a system board (30) that supports the power supply chip module (10) and the load chip module (20), the power supply chip module (10) and the load chip module (20) be respectively supported on surfaces of the system board (30) that face opposite sides, and be arranged so that when viewed in a direction (Z) orthogonal to a board surface of the system board (30), the outermost peripheral row (G1) in which the power supply output terminal group is arranged and the specific row (SG) face each other and the power supply chip module (10) and the load chip module (20) do not overlap, the second power supply output terminal group (12) be arranged in the outermost peripheral row (G1), the first power supply output terminal group (11) be arranged on an inner side of the outermost peripheral row (G1), the first power supply input terminal group (31) be arranged in the specific row (SG), and the second power supply input terminal group (32) be arranged on an inner side of the specific row (SG).

Similar to the above, according to this configuration, the first power supply output terminal group (11) and the first power supply input terminal group (31) can be connected in one wiring layer of the system board (30), and the second power supply output terminal group (12) and the second power supply input terminal group (32) can be connected in another one wiring layer. When the specific row (SG) is included in the outermost peripheral row (G1) of the load chip module (20), the first power supply output terminal group (11) and the first power supply input terminal group (31) can be connected, in the surface wiring layer on the surface (30b) supporting the load chip module (20) in the system board (30). Further, another wiring layer connecting the second power supply output terminal group (12) and the second power supply input terminal group (32) may be, for example, the surface wiring layer of the surface (30a) supporting the power supply chip module (10) on the rear surface of the surface (30b). In this case, the power supply chip module (10) and the load chip module (20) can be appropriately connected by the system board (30) having two wiring layers. When the specific row (SG) is not included in the outermost peripheral row (G1) of the load chip module (20), the first power supply output terminal group (11) and the first power supply input terminal group (31) are connected in the inner wiring layer. In this case, the power supply chip module (10) and the load chip module (20) can be appropriately connected by the system board (30) having three wiring layers, for example.

DESCRIPTION OF THE REFERENCE NUMERALS

1: Power supply chip module board
1a: Upper surface of power supply chip module board
1b: Lower surface of power supply chip module board
2: Semiconductor chip for power supply
3: Connection terminal
10: Power supply chip module
11: First power supply output terminal group
12: Second power supply output terminal group
20: Load chip module
21: Load chip module board
21a: Upper surface of load chip module board
21b: Lower surface of load chip module board
22: Load semiconductor chip
23: Load side connection terminal
30: System board
30y: Specific surface wiring layer
31: First power supply input terminal group
32: Second power supply input terminal group
41: First power supply wiring pattern (first wiring pattern)
42: Second power supply wiring pattern (second wiring pattern)
80: Circuit module
G1: Outermost peripheral row
G2: Inner peripheral row
L1: Arrangement direction
L2: Load side arrangement direction
R1: First region
R2: Second region
R21: Load side first region
R22: Load side second region
SG: Specific row
W11: Wiring width
W12: Wiring width
W31: Wiring width
W32: Wiring width

The invention claimed is:

1. A circuit module comprising:
a power supply chip module including a power supply chip module board that has a rectangular plate shape, at least one power supply semiconductor chip that is supported on an upper surface of the power supply chip module board, and a plurality of connection terminals that is arranged in a plurality of rows in a rectangular annular shape along each side of the power supply chip module board on a lower surface of the power supply chip module board and that is electrically connected to the power supply semiconductor chip;
a load chip module including a load chip module board that has a rectangular plate shape, at least one load semiconductor chip that is supported on an upper surface of the load chip module board, and a plurality of load side connection terminals that is arranged in a plurality of rows in a rectangular annular shape along each side of the load chip module board on a lower surface of the load chip module board and that is electrically connected to the load semiconductor chip; and
a system board that supports the power supply chip module and the load chip module, wherein
a power supply output terminal group having a plurality of terminals is included in the connection terminals,
a power supply input terminal group having a plurality of terminals connected to the power supply output terminal group is included in the load side connection terminals, the power supply output terminal group is arranged side by side in an outermost row along at least one side of the power supply chip module board,
the power supply input terminal group includes a specific terminal group arranged in a specific row that is a row along at least one side of the load chip module board, and
a wiring width along an arrangement direction of the power supply output terminal group of a wiring pattern in which the power supply output terminal group is connected to the system board is equal to or more than a wiring width along an arrangement direction of the specific terminal group of the wiring pattern in which the specific terminal group is connected to the system board.

2. The circuit module according to claim 1, wherein
the system board has a first wiring pattern formed on a specific surface wiring layer, which is one surface wiring layer of the system board, and a second wiring pattern formed on a different wiring layer from the specific surface wiring layer, as a power supply path connecting the power supply chip module and the load chip module,
the power supply output terminal group includes a first power supply output terminal group connected to the first wiring pattern and a second power supply output terminal group connected to the second wiring pattern,
the power supply input terminal group includes a first power supply input terminal group that includes the specific terminal group and that is connected to the first wiring pattern, and a second power supply input terminal group that is connected to the second wiring pattern,
a wiring width of the second wiring pattern is broader than a wiring width of the first wiring pattern,
the wiring width of the first wiring pattern at a part in which the first power supply output terminal group is connected is equal to or more than the wiring width of the first wiring pattern on a side of the load chip module, and
the wiring width of the second wiring pattern at a part in which the second power supply output terminal group is connected is equal to or more than the wiring width of the second wiring pattern on the side of the load chip module.

3. The circuit module according to claim 2, wherein
the power supply chip module and the load chip module are supported on the same surface of the system board, and are arranged so that a row in which the power supply output terminal group is arranged and the specific row face each other when viewed in a direction orthogonal to a board surface of the system board, the first power supply output terminal group is arranged in a row on an outer peripheral side of the second power supply output terminal group, and the first power supply input terminal group is arranged in a row on the outer peripheral side of the second power supply input terminal group.

4. The circuit module according to claim 2, wherein the power supply chip module and the load chip module are respectively supported on surfaces of the system board that face opposite sides, and the power supply chip module and the load chip module are arranged so that a row in which the power supply output terminal group is arranged and the specific row face each other and the power supply chip module and the load chip module do not overlap with each other when viewed in a direction orthogonal to a board surface of the system board, the first power supply output terminal group is arranged in a row on an inner peripheral side of the second power supply output terminal group, and the first power supply input terminal group is arranged in a row on an outer peripheral side of the second power supply input terminal group.

5. The circuit module according to claim 1, wherein the wiring width of the power supply output terminal group of the wiring pattern in which the power supply output terminal group is connected to the system board is wider than the wiring width along the arrangement direction of the specific terminal group of the wiring pattern in which the specific terminal group is connected to the system board.

6. A power supply chip module comprising:

a power supply chip module board that has a rectangular plate shape; at least one power supply semiconductor chip that is supported on an upper surface of the power supply chip module board; and a plurality of connection terminals that is arranged in a plurality of rows in a rectangular annular shape along each side of the power supply chip module board on a lower surface of the power supply chip module board and that is electrically connected to the power supply semiconductor chip, wherein the connection terminals include a first power supply output terminal group having a plurality of terminals that outputs a first voltage and a second power supply output terminal group having a plurality of terminals that outputs a second voltage, one power supply output terminal group of the first power supply output terminal group and the second power supply output terminal group is arranged in an outermost peripheral row that is an outermost peripheral row along at least one side of the power supply chip module board, the other power supply output terminal group of the first power supply output terminal group and the second power supply output terminal group is arranged along an arrangement direction of the power supply output terminal group in the outermost peripheral row, in one inner peripheral row that is an inner peripheral row of the outermost peripheral row, and a first region in which the first power supply output terminal group is arranged and a second region in which the second power supply output terminal group is arranged are at least partially overlapped, when viewed in a direction that is along the power supply chip module board and that is orthogonal when viewed from alignment directions of the power supply module board.

7. The power supply chip module according to claim 6, wherein among the first power supply output terminal group and the second power supply output terminal group, the terminal group with more terminals is set as a many-terminal group and the terminal group with less terminals is set as a few-terminal group, and an entire region in which the few-terminal group is arranged along the arrangement direction overlaps with a region in which the many-terminal group is arranged along the arrangement direction, when viewed in a direction that is along the power supply chip module board and that is orthogonal to the arrangement direction.

8. A circuit module comprising: the power supply chip module according to claim 6; and a load chip module connected to the power supply chip module, wherein the load chip module includes a load chip module board that has a rectangular plate shape, at least one load semiconductor chip that is supported on an upper surface of the load chip module board, and a plurality of load side connection terminals that is arranged in a plurality of rows in a rectangular annular shape along each side of the load chip module board on a lower surface of the load chip module board and that is electrically connected to the load semiconductor chip, the load side connection terminals include, as a power supply input terminal group, a first power supply input terminal group having a plurality of terminals connected to the first power supply output terminal group and a second power supply input terminal group having a plurality of terminal connected to the second power supply output terminal group, a region in which the first power supply input terminal group is arranged is set as a load side first region, and a region in which the second power supply input terminal group is arranged is set as a load side second region, in a row closest to the outermost peripheral row, an arrangement direction of the power supply input terminal group that is arranged along at least one side of the load chip module board is set as a load side arrangement direction, and the first power supply input terminal group is arranged so that a length of the load side first region in a direction along the load side arrangement direction is equal to or less than a length of the first region in a direction along the arrangement direction, and the second power supply input terminal group is arranged so that a length of the load side second region in the direction along the load side arrangement direction is equal to or less than a length of the second region in the direction along the arrangement direction.

9. The circuit module according to claim 8, wherein one of the first power supply terminal group and the second power supply input terminal group is arranged in a specific row that is any one of a plurality of rows along the load side arrangement direction, and the other one of the first power supply input terminal group and the second power supply input terminal group is arranged on an inner side of the specific row.

10. The circuit module according to claim 8, wherein the wiring width of one power supply output terminal group of the first power supply output terminal group and the second power supply output terminal group of the wiring pattern in which the one of power supply output terminal group is connected to the system board is wider than the wiring width along the arrangement direction of a corresponding one of the first power supply input terminal group and the second power supply input terminal group of the wiring pattern in which the corresponding one of the first power supply input terminal group and the second power supply input terminal group is connected to the system board.

11. The circuit module according to claim 9, further comprising a system board that supports the power supply chip module and the load chip module, wherein
the power supply chip module and the load chip module are supported on the same surface of the system board, and are arranged so that the outermost peripheral row in which the power supply output terminal group is arranged and the specific row face each other when viewed in a direction orthogonal to a board surface of the system board,
the first power supply output terminal group is arranged in the outermost peripheral row,
the second power supply output terminal group is arranged on an inner side of the outermost peripheral row,
the first power supply input terminal group is arranged in the specific row, and
the second power supply input terminal group is arranged on an inner side of the specific row.

12. The circuit module according to claim 9, further comprising a system board that supports the power supply chip module and the load chip module, wherein
the power supply chip module and the load chip module are respectively supported on surfaces of the system board that face opposite sides, and are arranged so that when viewed in a direction orthogonal to a board surface of the system board, the outermost peripheral row in which the power supply output terminal group is arranged and the specific row face each other and the power supply chip module and the load chip module do not overlap,
the second power supply output terminal group is arranged in the outermost peripheral row,
the first power supply output terminal group is arranged on an inner side of the outermost peripheral row,
the first power supply input terminal group is arranged in the specific row, and
the second power supply input terminal group is arranged on an inner side of the specific row.

13. The circuit module according to claim 6, wherein a wiring width of one power supply output terminal group of the first power supply output terminal group and the second power supply output terminal group of the wiring pattern in which the one of power supply output terminal group is connected to a system board is wider than the wiring width within the system board.

\* \* \* \* \*